(12) United States Patent
Takeda

(10) Patent No.: US 8,937,498 B2
(45) Date of Patent: Jan. 20, 2015

(54) COMMON MODE NOISE REDUCTION CIRCUIT, DIFFERENTIAL SIGNAL TRANSMITTING APPARATUS, DIFFERENTIAL SIGNAL TRANSMITTING SYSTEM AND CAR ELECTRONICS DEVICE

(71) Applicant: Panasonic Corporation, Osaka (JP)

(72) Inventor: Noriaki Takeda, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/262,412

(22) Filed: Apr. 25, 2014

(65) Prior Publication Data

US 2014/0340144 A1 Nov. 20, 2014

(30) Foreign Application Priority Data

May 16, 2013 (JP) .................................. 2013-104047

(51) Int. Cl.
*H03K 3/00* (2006.01)
*H03H 11/30* (2006.01)
(52) U.S. Cl.
CPC ..................................... *H03H 11/30* (2013.01)
USPC .......................................................... 327/108

(58) Field of Classification Search
USPC ........................................................... 327/108
See application file for complete search history.

(56) References Cited

U.S. PATENT DOCUMENTS 7,535,258 B1 * 5/2009 Johnson et al. .................. 326/82

FOREIGN PATENT DOCUMENTS

JP 2012-105135 A 5/2012

* cited by examiner

*Primary Examiner* — Daniel Rojas
(74) *Attorney, Agent, or Firm* — McDermott Will & Emery LLP

(57) ABSTRACT

A common mode noise reduction circuit works with a transmission signal output circuit that has a first and a second output terminals and transmits differential signals from the first and second output terminals. The common mode noise reduction circuit includes: a first generating circuit to generate electric current to input to or receive electric current from the first output terminal; a second generating circuit to generate electric current to input to or output receive electric current from the second output terminal; and a control circuit to control the first and second generating circuits so that in synchronism with a drive control clock of the transmission signal output circuit, the first and second generating circuits generate current pulses to reduce common mode noise of the differential signals to be transmitted.

16 Claims, 17 Drawing Sheets

FIG. 7

| Case | Conditions of switching transistors in transmission signal output circuit 12 | | Switching transistor(s) selected in current pulse generating circuits 16 and 17 | |
|---|---|---|---|---|
| | Switching transistor | The switching transistor indicated in the box on the left changes its level faster or slower than the other switching transistors | Signal Y0 changes from low level to high level | Signal Y0 changes from high level to low level |
| S1 | 33 | faster | 23a,24b | 23b |
| S2 | 33 | slower | 23b | 23a,24b |
| S3 | 34 | faster | 24b | 23b,24a |
| S4 | 34 | slower | 24a,23b | 24b |
| S5 | 35 | faster | 23a | 23b,24a |
| S6 | 35 | slower | 23b,24a | 23a |
| S7 | 36 | faster | 23a,24b | 24a |
| S8 | 36 | slower | 24a | 24b,23a |
| S9 | 33,34 | faster | 24b | 23b |
| S10 | 33,35 | faster | 23a,24b | 23b,24a |
| S11 | 33,36 | faster | 23a,24b | 23b,24a |
| S12 | 34,35 | faster | 23a,24b | 23b,24a |
| S13 | 34,36 | faster | 23a,24b | 23b,24a |
| S14 | 35,36 | faster | 23a | 24a |

72,73,74,75,81,82,83,84

COMMON MODE NOISE REDUCTION CIRCUIT, DIFFERENTIAL SIGNAL TRANSMITTING APPARATUS, DIFFERENTIAL SIGNAL TRANSMITTING SYSTEM AND CAR ELECTRONICS DEVICE

This application claims priority to Japanese Patent Application No. 2013-104047, filed on May 16, 2013, the contents of which are hereby incorporated by reference.

BACKGROUND

1. Technical Field

The present disclosure relates to a common mode noise reduction circuit to reduce common mode noise generated, for example, from an image data communication interface between a display apparatus (e.g. liquid crystal display) and an image processor LSI. The present disclosure also relates to a differential signal transmitting apparatus including the common mode noise reduction circuit. The present disclosure further relates to a differential signal transmitting system including the differential signal transmitting apparatus, and a car electronics device including the differential signal transmitting system.

2. Description of Related Art

Along with the advance of the digital moving picture technology, high quality moving pictures have become available for mobile devices represented by smartphones, tablet devices, or the like. These kinds of small display devices that can display high quality moving pictures have started to be used as car electronics devices, such as car navigation systems, car entertainment apparatuses for playing movies or the like, and instrument panels to display information necessary for driving, such as speedometers, fuel gauges and odometers. Further, technologies that project an image in front of a wind shield so that drivers can obtain necessary information without looking away from their usual viewpoints, such as head-up displays or the like are being actively developed.

On the other hand, in order to realize these kinds of high quality image displays, a large amount of image data need to be transmitted to display devices. Accordingly, data communication bandwidth at interfaces between display devices and image processor LSIs has been steadily broadening. Due to the broadening communication bandwidth, electromagnetic radiation noise generated at interfaces between display devices and image processor LSIs has become a critical problem. Reduction of the electromagnetic radiation noise has become an important technical object for car electronics devices among others, and strict regulations have been implemented for safety.

Small amplitude differential interfaces represented by LVDS (Low Voltage Differential Swing) are widely employed for interfaces between display devices and image processor LSIs. It is widely known that transmitting signals through a pair of differential lines allows the magnetic fields generated from the differential lines to cancel out each other so that the adverse effect of the electromagnetic radiation is reduced.

As stated above, the differential mode component of the electromagnetic radiation can be canceled out. However, the common mode component of the electromagnetic radiation is not canceled out. Therefore, some electromagnetic radiation remains. Common mode voltages are controlled to maintain certain values. However, switching noise generated at switching when a transmitter generates data becomes common mode and appears as common mode noise. The switching frequencies and switching speeds of those transmitting apparatuses have increased as the communication bandwidth becomes wider, thereby increasing electromagnetic radiation noise.

A conventional common mode noise reduction circuit optimizes a control signal of a transistor depending on the polarization of the transistor that forms a switch, in order to reduce the switching noise. (For example, see Japanese Patent Application Laid-open No. 2012-105135.)

SUMMARY

However, in the conventional structure, because an input signal level of the transistor is limited, the transistor size has to be large enough to flow the necessary electric current. As a result, a parasitic capacity of the transistor becomes large, thereby hindering high speed operation.

Thus, a non-limiting exemplary embodiment of the present disclosure provides a common mode noise reduction circuit that can reduce common mode noise without hindering high speed operation.

A common mode noise reduction circuit according to an aspect of the present disclosure works with a transmission signal output circuit that has a first and a second output terminals and transmits differential signals from the first and second output terminals. The common mode noise reduction circuit includes: a first generating circuit to generate electric current to input to the first output terminal or receive electric current from the first output terminal; a second generating circuit to generate electric current to input to the second output terminal or receive electric current from the second output terminal; and a control circuit to control the first and second generating circuits so that in synchronism with a drive control clock of the transmission signal output circuit, the first and second generating circuits generate current pulses to reduce common mode noise of the differential signals to be transmitted.

A common mode noise reduction circuit according to an aspect of the present disclosure can reduce common mode noise without hindering high speed operation. This general and particular aspect can be implemented as a system, a method, a computer program or a combination thereof. Other benefits and advantages of embodiments disclosed herein will become apparent from the following description and attached drawings. The benefits and/or advantages can be provided individually by various embodiments and the matter that is disclosed in the description and drawings. It should be noted, however, that not every portion described must be included to achieve one or more of those benefits and advantages.

BRIEF DESCRIPTION OF THE DRAWINGS

FIG. 7 shows a switch control table stored in table memory 18 shown in FIG.

DETAILED DESCRIPTION

Hereinafter, embodiments of the present disclosure will be described referring to the accompanying drawings. Note that throughout the accompanying drawings, the same reference marks are used to designate the same or similar components, and detailed descriptions thereof are omitted.

Embodiment 1

Figure 1:
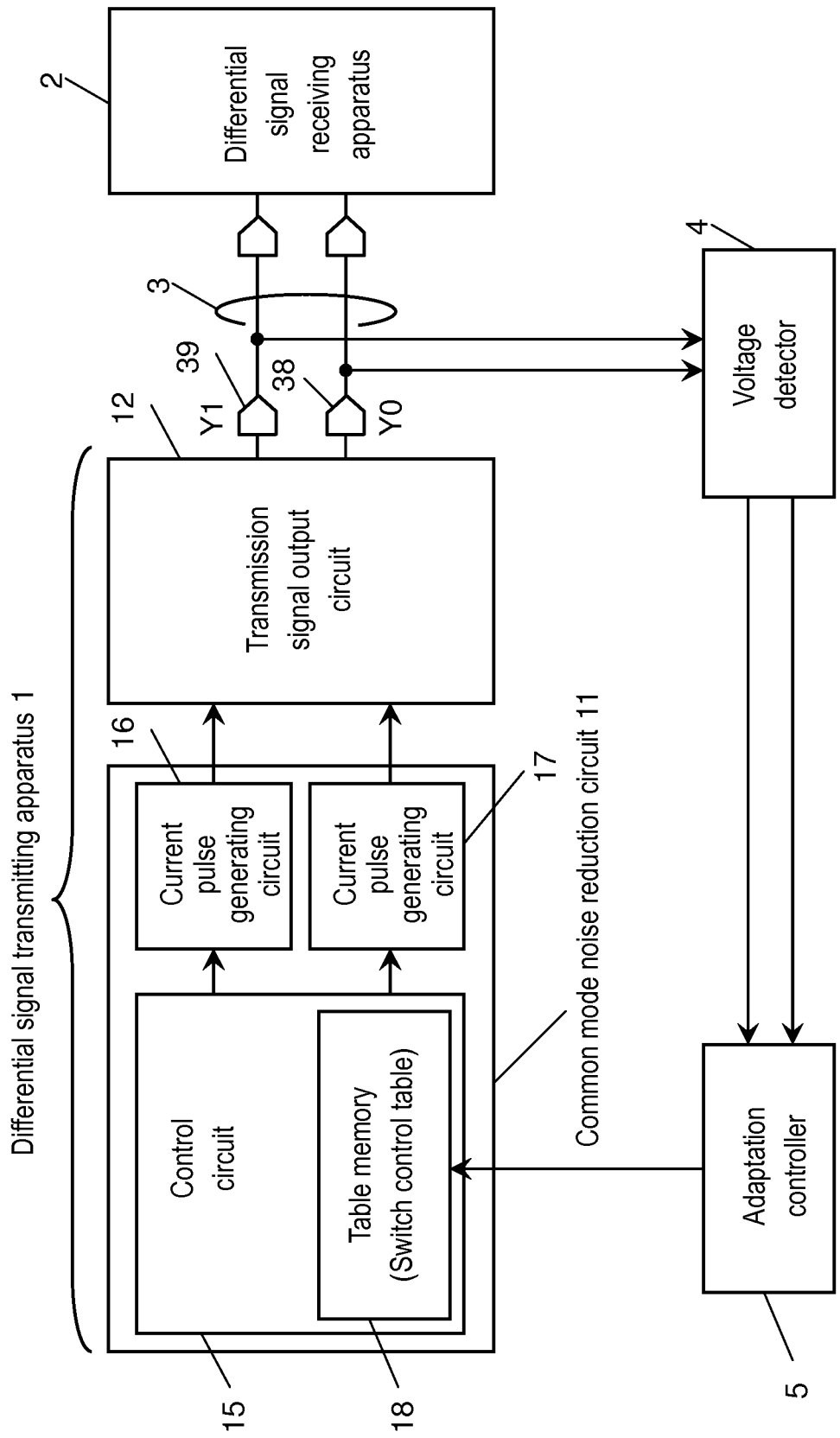
FIG. 1 is a block diagram showing a configuration of a differential signal transmitting system according to Embodiment 1 of the present disclosure.
Figure 2:
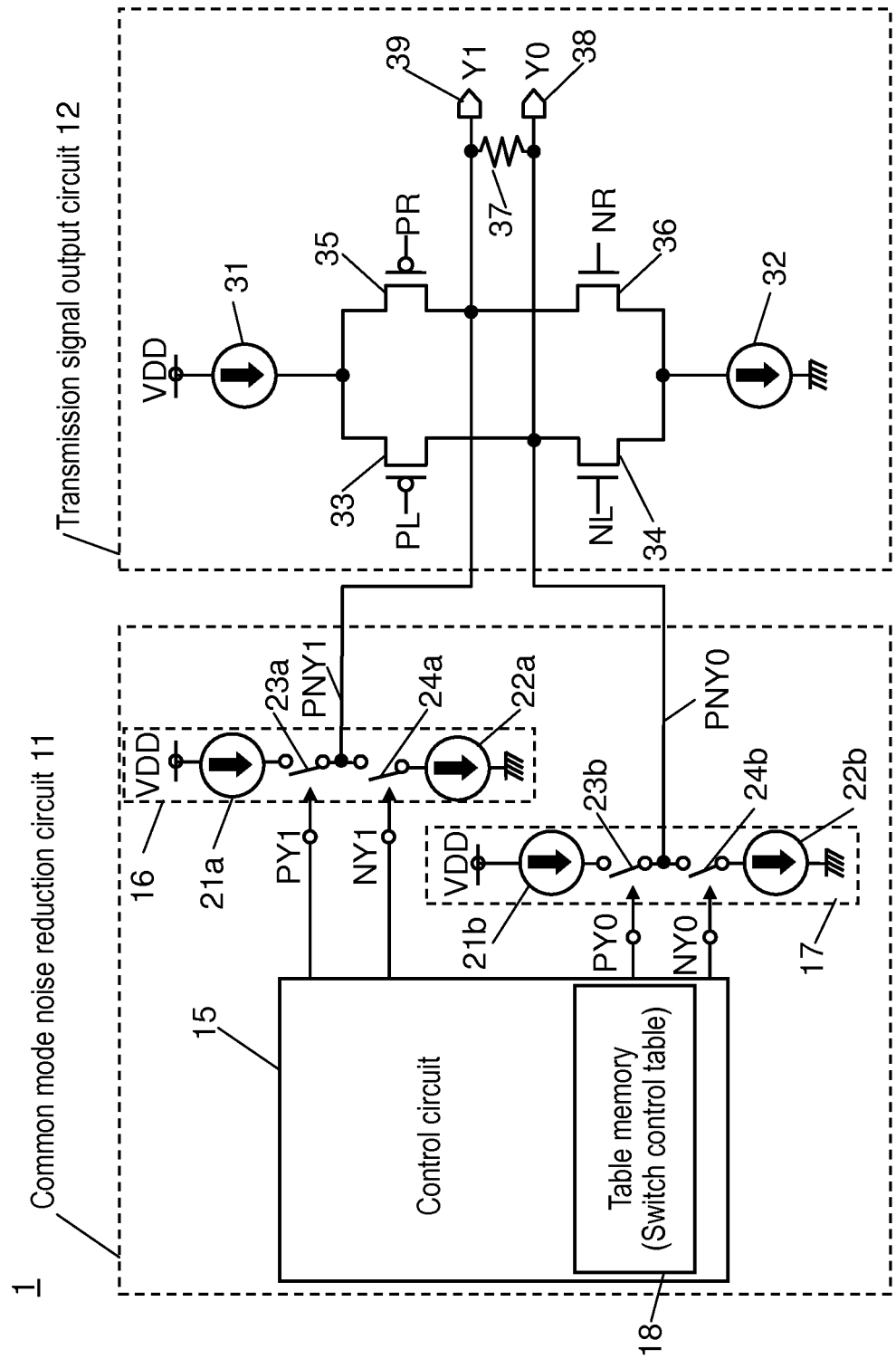
FIG. 2 is a circuit diagram showing a configuration of common mode noise reduction circuit 11 and transmission signal output circuit 12 of differential signal transmitting apparatus 1 shown in FIG. 1.

FIG. 1 is a block diagram showing a configuration of a differential signal transmitting system of Embodiment 1 of the present disclosure. FIG. 2 is a circuit diagram showing a configuration of common mode noise reduction circuit 11 and transmission signal output circuit 12 of differential signal transmitting apparatus 1 shown in FIG. 1.

As shown in FIG. 1, the differential signal transmitting system of the embodiment comprises the following structural elements:

differential signal transmitting apparatus 1 to transmit differential signals;

differential signal receiving apparatus 2 to receive the differential signals; and differential signal transmitting lines 3 to connect differential signal transmitting apparatus 1 and differential signal receiving apparatus 2.

Differential signal transmitting apparatus 1 comprises common mode noise reduction circuit 11 and transmission signal output circuit 12. Common mode noise reduction circuit 11 comprises two current-pulse generating circuits 16 and 17, and control circuit 15 having table memory 18 storing a switch control table to control current-pulse generating circuits 16 and 17. The differential signal transmitting system further comprises the following structural elements:

voltage detector 4 to detect signal voltages of differential signals Y0 and Y1 output from output terminal 38 or 39 of transmission signal output circuit 12; and adaptation controller 5 to prepare, fix and store the switch control table of table memory 18 based on the detected two signal voltages, or to adaptively control the switch control table of table memory 18 based on the detected two signal voltages.

Configuration and operation of transmission signal output circuit 12 will be described below referring to FIG. 2.

As shown in FIG. 2, transmission signal output circuit 12 comprises: current source transistors 31 and 32 to work as current sources from which a fixed amount of electric current flows; switching transistors 33, 34, 35 and 36; terminal resistor 37; and output terminals 38 and 39. Each of switching transistors 33 and 35 includes, for example, a P-channel MOS transistor (herein after referred to as PMOS transistor.) Each of switching transistors 34 and 36 includes, for example, an N-channel MOS transistor (herein after referred to as NMOS transistor.) Current source transistor 31, switching transistors 33 and 34, and current source transistor 32 are serially connected between a direct-current power supply having voltage VDD and the ground. Current source transistor 31, switching transistors 35 and 36, and current source transistor 32 are serially connected between the direct-current power supply having voltage VDD and the ground. A drain of switching transistor 33 and a drain of switching transistor 34 are connected to output terminal 38. A drain of switching transistor 35 and a drain of switching transistor 36 are connected to output terminal 39. Terminal resistor 37 is connected between output terminals 38 and 39.

Transmission signal output circuit 12 configured as described above transmits differential signals that are data signals. The differential signals indicate digital binary values in response to the direction of a current in terminal resistor 37. The direction of the current is controlled by switching transistors 33 to 36. For example, when switching transistor 33 turns on, switching transistor 34 turns off, switching transistor 35 turns off, and switching transistor 36 turns on, the current generated by current source transistor 31 flows through switching transistor 33, terminal resistor 37, and switching transistor 36 to flow in current source transistor 32. In this case, voltage VY0 of signal Y0 at output terminal 38 is higher than voltage VY1 of signal Y1 at output terminal 39. This state corresponds to a digital value "0" in this embodiment.

To the contrary, for example, when switching transistor 33 turns off, switching transistor 34 turns on, switching transistor 35 turns on, and switching transistor 36 turns off, the current generated by current source transistor 31 flows through switching transistor 35, terminal resistor 37, and switching transistor 34, and finally to flow into current source transistor 32. In this case, the direction of the current in terminal resistor 37 is opposite to the previous case, and voltage VY1 is higher than voltage VY0. This state corresponds to a digital value "1" in this embodiment. As stated above, transmission signal output circuit 12 transmits data signals that are differential signals to indicate digital binary values changing the direction of the current in terminal resistor 37 by switching transistors 33, 34, 35 and 36 that control the current generated by current source transistors 31 and 32.

Configuration and operation of common mode noise reduction circuit 11 will be described below referring to FIG. 2.

As shown in FIG. 2, common mode noise reduction circuit 11 comprises: current-pulse generating circuit 16 connected to output terminal 39 of differential signal transmitting apparatus 1; current-pulse generating circuit 17 connected to output terminal 38; table memory 18 storing the switch control table to control current-pulse generating circuits 16 and 17; and control circuit 15 to control the operation of current-pulse generating circuits 16 and 17 to generate and inject current pulses PNY0 and PNY1 to cancel switching noise that appears in signals Y0 and Y1. Current-pulse generating circuit 16 comprises: current source transistor 21a; switching transistor 23a that is controlled by switch control signal PY1 from control circuit 15; switching transistor 24a that is controlled by switch control signal NY1 from control circuit 15; and current source transistor 22a. Current source transistors 21a and 22a, and switching transistors 23a and 24a are serially connected between power source voltage VDD and the ground. Current-pulse generating circuit 17 comprises: current source transistor 21b; switching transistor 23b that is controlled by switch control signal PY0 from control circuit 15; switching transistor 24b that is controlled by switch control signal NY0 from control circuit 15; and current source transistor 22b. Current source transistors 21b and 22b, and switching transistors 23b and 24b are serially connected between power source voltage VDD and the ground.

In common mode noise reduction circuit 11 described above, a turn-on of switching transistor 23a allows generating current pulse PNY1 and inputting it to output terminal 39, and a turn-on of switching transistor 24a allows generating current pulse PNY1 and receiving it from output terminal 39. A turns-on of switching transistor 23b allows generating current pulse PNY0 and inputting it to output terminal 38, and turns-on of switching transistor 24b allows generating current pulse PNY0 and receiving it from output terminal 38. Control circuit 15 controls current-pulse generating circuit 16 to generate electric current to input to or receive electric current from output terminal 39 for a predetermined period at a predetermined timing. Control circuit 15 also controls current-pulse generating circuit 17 to generate electric current to input to or receive electric current from output terminal 38 for a predetermined period at a predetermined timing. The predetermined timings and predetermined periods are previously set in control circuit 15 according to a measurement result of common mode noise of transmission signal output circuit 12 as described later.

Figure 3A:
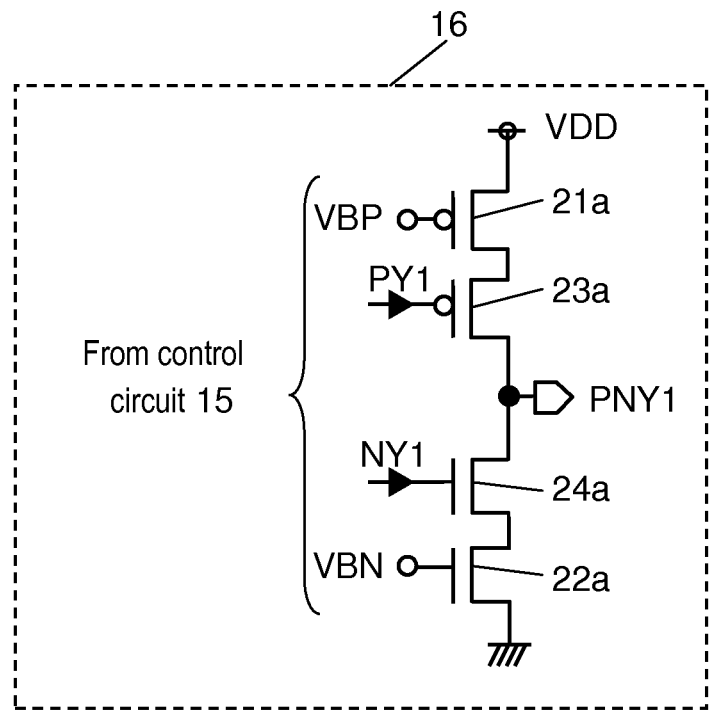
FIG. 3A is a circuit diagram showing a configuration of current-pulse generating circuit 16 shown in FIG. 2.

FIG. 3A is a circuit diagram showing a configuration of current-pulse generating circuit 16 shown in FIG. 2. As shown in FIG. 3A, current source transistor 21a includes a PMOS transistor. A value of a current flowing in current source transistor 21a is controlled based on gate bias voltage VBP from control circuit 15. Current source transistor 22a includes an NMOS transistor. A value of a current flowing in current source transistor 22a is controlled based on gate bias voltage VBN from control circuit 15. Current-pulse generating circuit 17 shown in FIG. 2 is configured in the same manner as current-pulse generating circuit 16 shown in FIG. 3A.

Figure 3B:
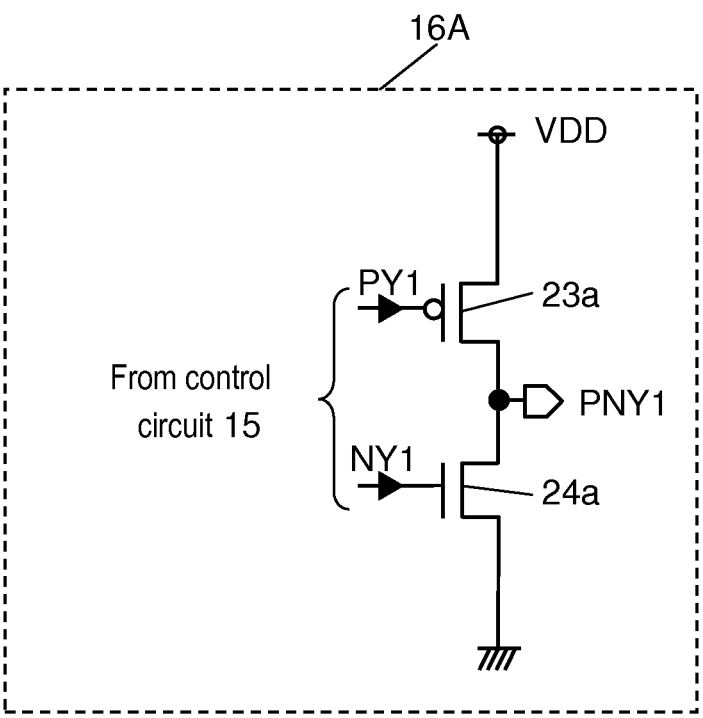
FIG. 3B is a circuit diagram showing a configuration of current-pulse generating circuit 16A that is a first modified example of current-pulse generating circuit 16 shown in FIG. 2.

FIG. 3B is a circuit diagram showing a configuration of current-pulse generating circuit 16A that is a first modified example of current-pulse generating circuit 16 shown in FIG. 2. As shown in FIG. 3B, current-pulse generating circuit 16A of the first modified example does not include current source transistors 21a and 22a. Further, an amount of a current flowing through current-pulse generating circuit 16A is controlled by a current flowing in switching transistors 23a and 24a. This is a different point from current-pulse generating circuit 16 shown in FIG. 2. A first modified example of current-pulse generating circuit 17 is configured in the same manner as current-pulse generating circuit 16A shown in FIG. 3B.

Figure 3C:
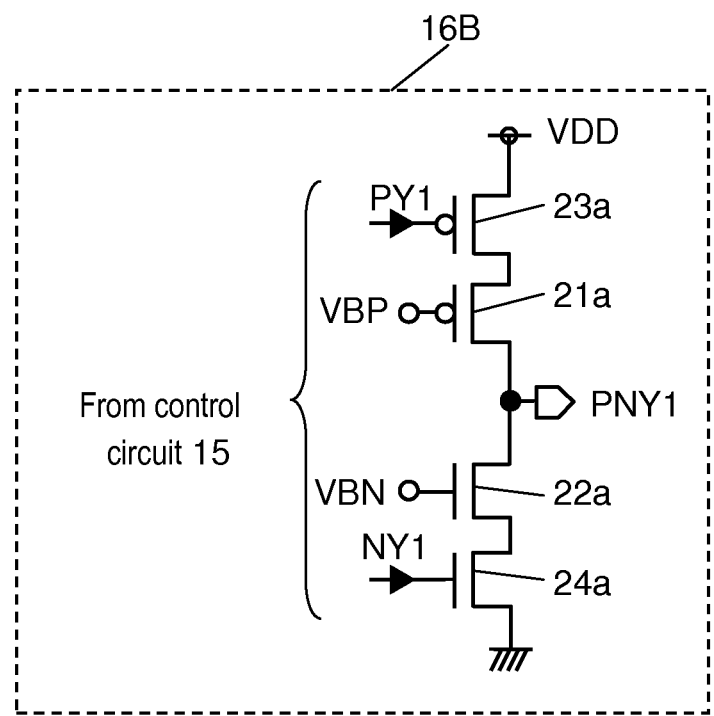
FIG. 3C is a circuit diagram showing a configuration of current-pulse generating circuit 16B that is a second modified example of current-pulse generating circuit 16 shown in FIG. 2.

FIG. 3C is a circuit diagram showing a configuration of current-pulse generating circuit 16B that is a second modified example of current-pulse generating circuit 16 shown in FIG. 2. As shown in FIG. 3C, in current-pulse generating circuit 16B of the second modified example, inserted positions of current source transistor 21a and switching transistor 23a are reversed to each other and inserted positions of current source transistor 22a and switching transistor 24a are reversed to each other comparing to those of current-pulse generating circuit 16 shown in FIG. 3A. A second modified example of current-pulse generating circuit 17 is configured in the same manner as current-pulse generating circuit 16B shown in FIG. 3C.

Figure 4:
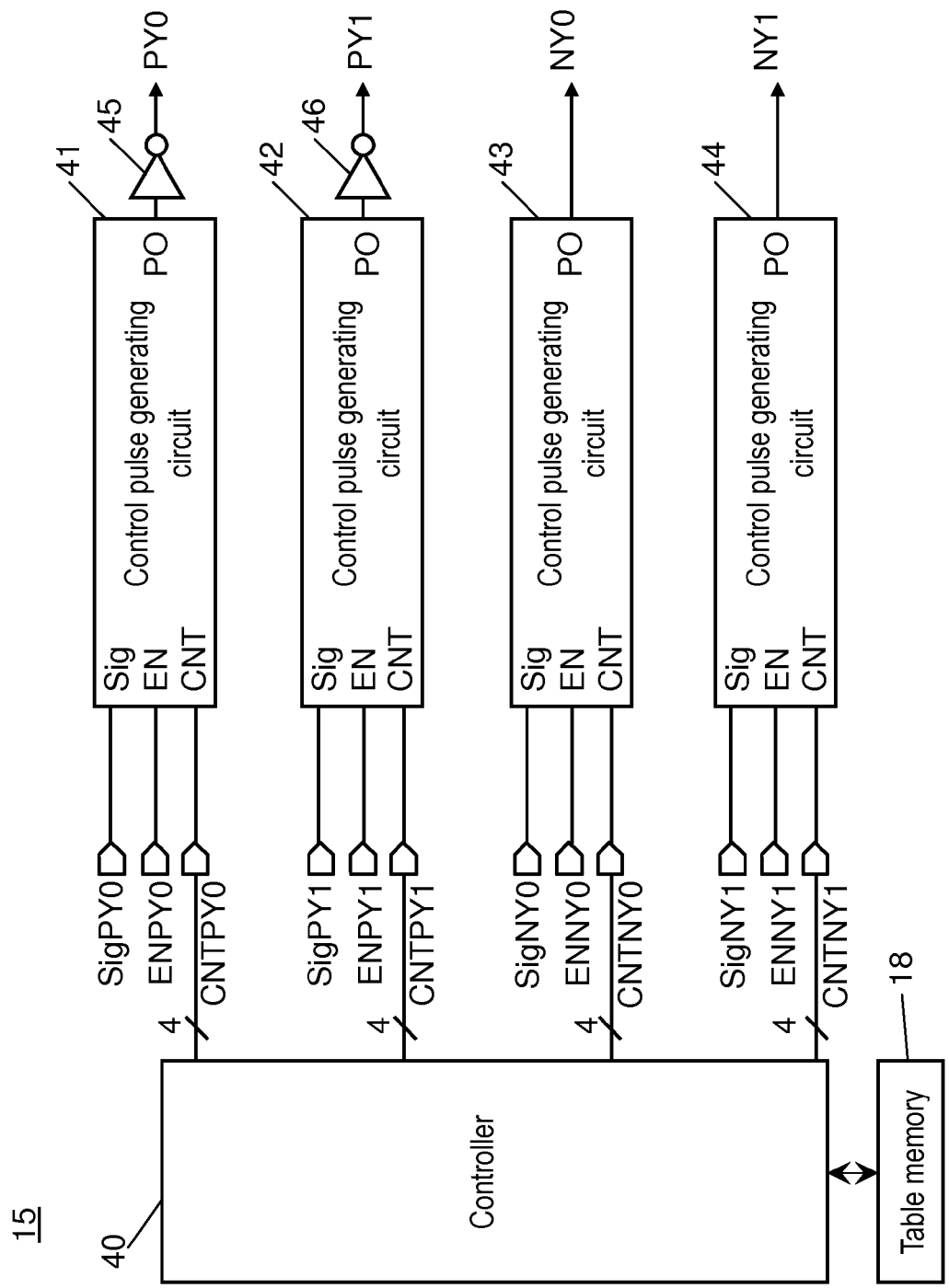
FIG. 4 is a block diagram showing a configuration of control circuit 15 shown in FIGS. 1 and 2.

FIG. 4 is a block diagram showing a configuration of control circuit 15 shown in FIGS. 1 and 2. As shown in FIG. 4, control circuit 15 comprises: table memory 18; four control pulse generating circuits 41, 42, 43 and 44; controller 40 to generate control data signals CNTPY0, CNTPY1, CNTNY0 and CNTNY1 to control the operation of control pulse generating circuits 41, 42, 43 and 44; and two inverters 45 and 46. Control pulse generating circuit 41 generates switch control signal PY0 based on data signal SigPY0 (e.g. a video signal from an outside circuit), enable signal ENPY0 for data signal SigPY0, and control data signal CNTPY0. Control pulse generating circuit 41 outputs switch control signal PY0 through inverter 45 to switching transistor 23b of current-pulse generating circuit 17 shown in FIG. 2. Control pulse generating circuit 42 generates switch control signal PY1 based on data signal SigPY1 (e.g. a video signal from an outside circuit), enable signal ENPY1 for data signal SigPY1, and control data signal CNTPY1. Control pulse generating circuit 42 outputs switch control signal PY1 through inverter 46 to switching transistor 23a of current-pulse generating circuit 16 shown in FIG. 2. Control pulse generating circuit 43 generates switch control signal NY0 based on data signal SigNY0 (e.g. a video signal from an outside circuit), enable signal ENNY0 for data signal SigNY0, and control data signal CNTNY0. Control pulse generating circuit 43 outputs switch control signal NY0 to switching transistor 24b of current-pulse generating circuit 17 shown in FIG. 2. Control pulse generating circuit 44 generates switch control signal NY1 based on data signal SigNY1 (e.g. a video signal from an outside circuit), enable signal ENNY1 for data signal SigNY1, and control data signal CNTNY1. Control pulse generating circuit 44 outputs switch control signal NY1 to switching transistor 24a of current-pulse generating circuit 16 shown in FIG. 2.

Figure 5A:
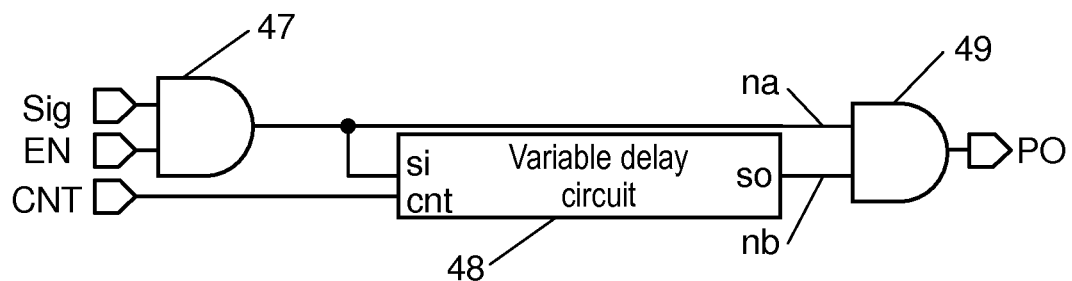
FIG. 5A is a block diagram showing a configuration of control pulse generating circuits 41, 42, 43 and 44 shown in FIG. 4.

FIG. 5A is a block diagram showing a configuration of control pulse generating circuits 41, 42, 43 and 44 shown in FIG. 4. As shown in FIG. 5A, each of control pulse generating circuits 41 to 44 comprises two AND gates 47 and 49, and variable delay circuit 48. Control pulse generating circuits 41, 42, 43 and 44 have the same configuration. A data signal input in terminal Sig passes through AND gate 47 when an enable signal input in terminal EN is active. Variable delay circuit 48 inputs the data signal from AND gate 47 and outputs the data signal to AND gate 49 as signal na without any change. In parallel, variable delay circuit 48 delays the data signal from AND gate 47 by predetermined delay time Td (See FIG. 5B) based on a control data signal input in terminal CNT, and inverts the data signal so that the delayed and inverted data signal is output to AND gate 49 as signal nb. AND gate 49 performs AND logic operation of signals na and nb and outputs the result of the logic operation from terminal PO.

Figure 5B:
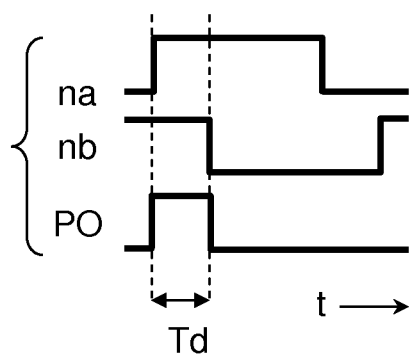
FIG. 5B is a timing chart showing an operation example of control pulse generating circuits 41, 42, 43 and 44 shown in FIG. 5A.

FIG. 5B is a timing chart showing an operation example of control pulse generating circuits 41, 42, 43 and 44 shown in FIG. 5A. As shown in FIG. 5B, in the case that the enable signal input in terminal EN is "1" (or H level), the data signal input in terminal Sig is output as signal na. Signal na is delayed by predetermined delay time Td (see FIG. 5B) based on the control data signal input in terminal CNT and inverted when going through variable delay circuit 48 so that the delayed and inverted signal is output from variable delay circuit 48. AND gate 49 obtains the AND logic result of the signals na and nb, so that a pulse signal having a width of predetermined time Td from a rising edge of the data signal input in terminal Sig is output to terminal PO. In the case that the enable signal input in terminal EN is"0" (or L level), signal na is fixed to "0" (or L level), so that the pulse (to terminal PO) is not generated.

Figure 6:
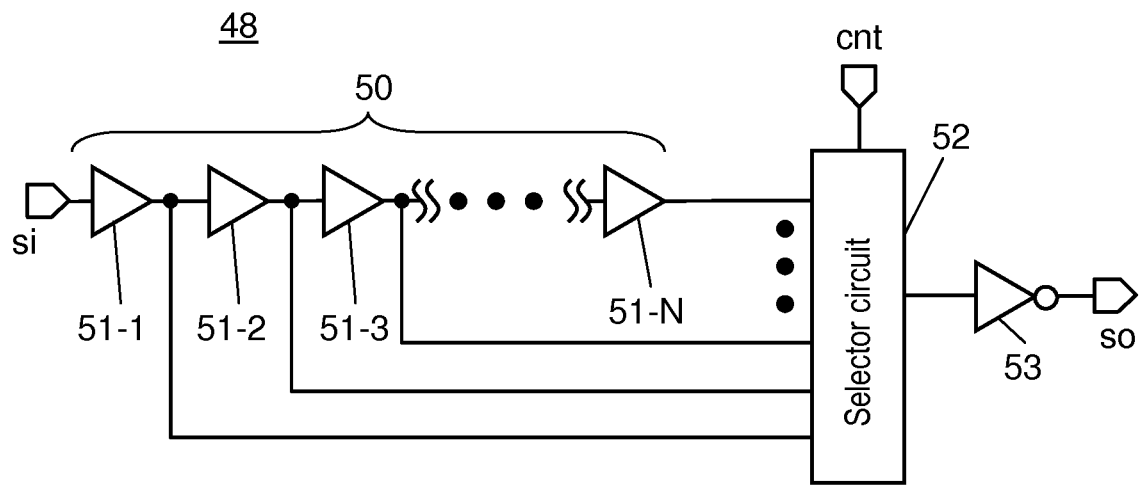
FIG. 6 is a circuit diagram showing a configuration of variable delay circuit 48 shown in FIG. 5A.

FIG. 6 is a circuit diagram showing a configuration of variable delay circuit 48 shown in FIG. 5A. As shown in FIG. 6, variable delay circuit 48 comprises: buffer circuit 50 including a plurality of serially connected buffers 50-1 to 50-N for delaying the data signal input in terminal si; and selector circuit 52 to select one of data signals output from each of output terminals of buffers 50-1 to 50-N based on the control data signal input in terminal cnt, to output the selected data signal through inverter 53 to terminal so.

In foregoing variable delay circuit 48, the data signal input in terminal si is delayed by a time per buffer every time the data signal goes through buffers 50-1 to 50-N. Selector circuit 52 is connected to each of the output terminals of buffers 50-1 to 50-N. The delay time of variable delay circuit 48 can be variably controlled by the control data signal input in terminal cnt. The control data signal selects the number of the buffers that the data signal should go through. The signal selected by selector circuit 52 is inverted by inverter 53 so that the selected and inverted signal is output. According to the structure stated above, when the signal input in terminal EN of control pulse generating circuits 41 to 44 is "1" (or H level), a pulse having a width of delay time Td from the rising edge of the data signal input in terminal Sig is generated. This delay time Td is selected by the control data signal input in terminal cnt. A timing of generating the pulse can be adjusted by adjusting a transition timing of the signal input in terminal Sig.

An operation of common mode noise reduction circuit 11 will be described below referring to FIG. 2.

The inventor examines the time when a current flow state of electric current flowing from current source transistor 31 through switching transistor 35, terminal resistor 37 and switching transistor 34 to current source transistor 32 changes to another current flow state of electric current flowing from current source transistor 31 through switching transistor 33, terminal resistor 37 and switching transistor 36 to current source transistor 32. In this case, ideally, all of switching transistors 33 to 36 should switch at exactly the same timing. In reality, however, the switch timings of switching transistors 33 to 36 may be different from each other because properties of switching transistors 33 to 36 or timings of control signals for switching transistors 33 to 36 may be different from each other.

For example, in a case in which switching transistor 34 changes from an on state to an off state faster than the other switching transistors 33, 35 and 36, an impedance of switching transistor 34 increases so that a voltage level of signal Y0 rises. The current flowing in terminal resistor 37 is maintained at a certain level by current source transistors 31 and 32, so that the current level in terminal resistor 37 does not change. Therefore, a voltage level of signal Y1 rises by the same amount as that of signal Y0 to generate common mode noise. In order to reduce this common mode noise, the voltage rise of signal Y0 can be reduced. To be more specific, the voltage rise of signal Y0 can be reduced by releasing the voltage rise, which is caused by an impulsive increase of the impedance, to current-pulse generating circuit 17. The voltage rise is released to current-pulse generating circuit 17 by turning on switching transistor 24b of current-pulse generating circuit 17. Switching transistor 24b is maintained in the on state for a period by which switching transistor 34 turns off faster than the other transistors. Similarly, current-pulse generating circuits 16 and 17 input or output current in a direction for reducing noise so that common mode noise component that is generated in signals Y0 and Y1 by turning on or off of switching transistors 33 to 36 is reduced. The operation example described above corresponds to case S3 of FIG. 7, which will be described later.

A more detailed operation of common mode noise reduction circuit 11 will be described below, referring to FIGS. 7, and 8A to 8D.

Figure 8A:
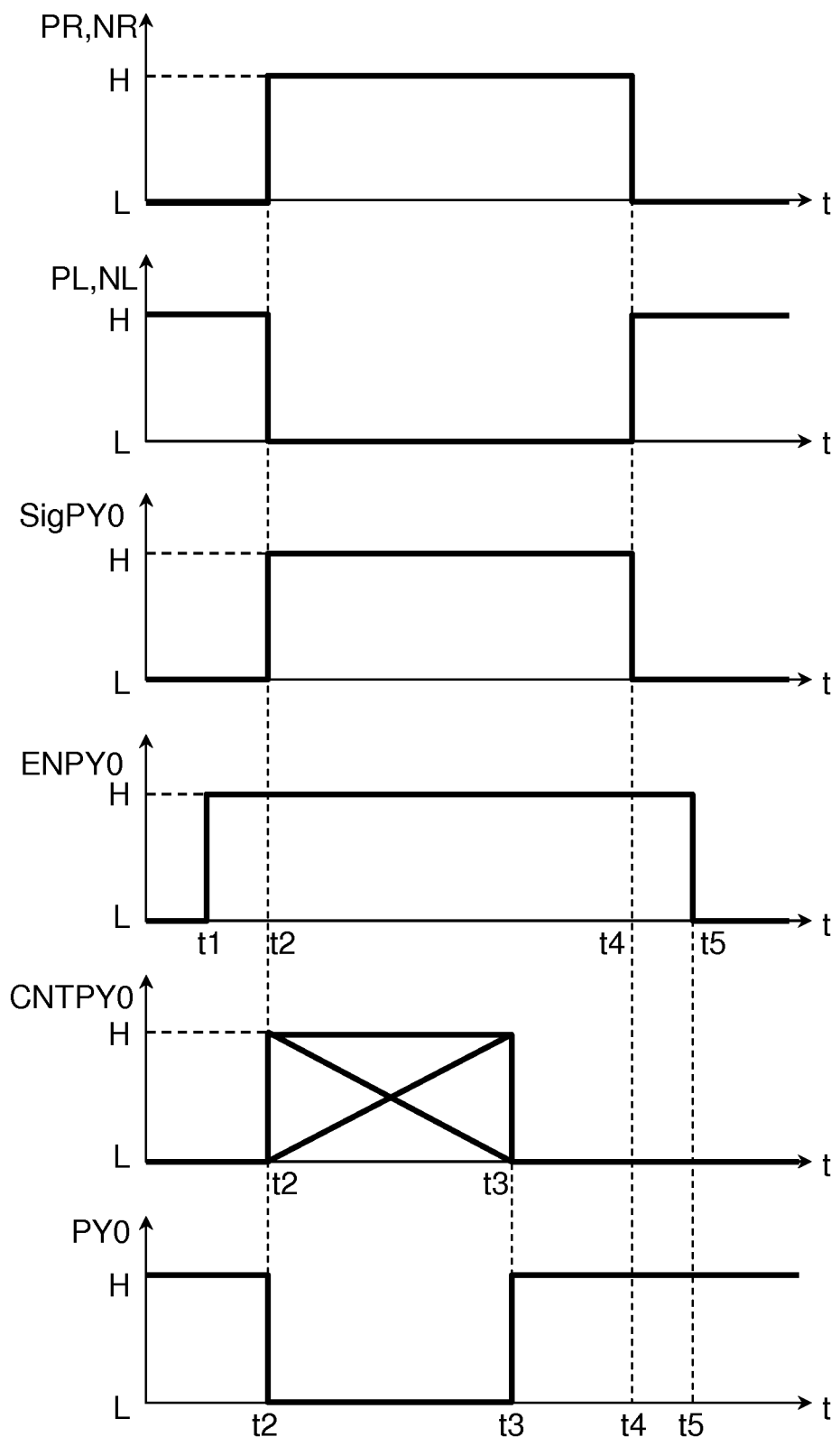
FIG. 8A is a timing chart of switch drive control signals PR, NR, PL, and NL, data signal SigPY0, enable signal ENPY0, control data signal CNTPY0, and switch control signal PY0 for showing an operation example of differential signal transmitting apparatus 1 shown in FIGS. 1 and 2.
Figure 8B:
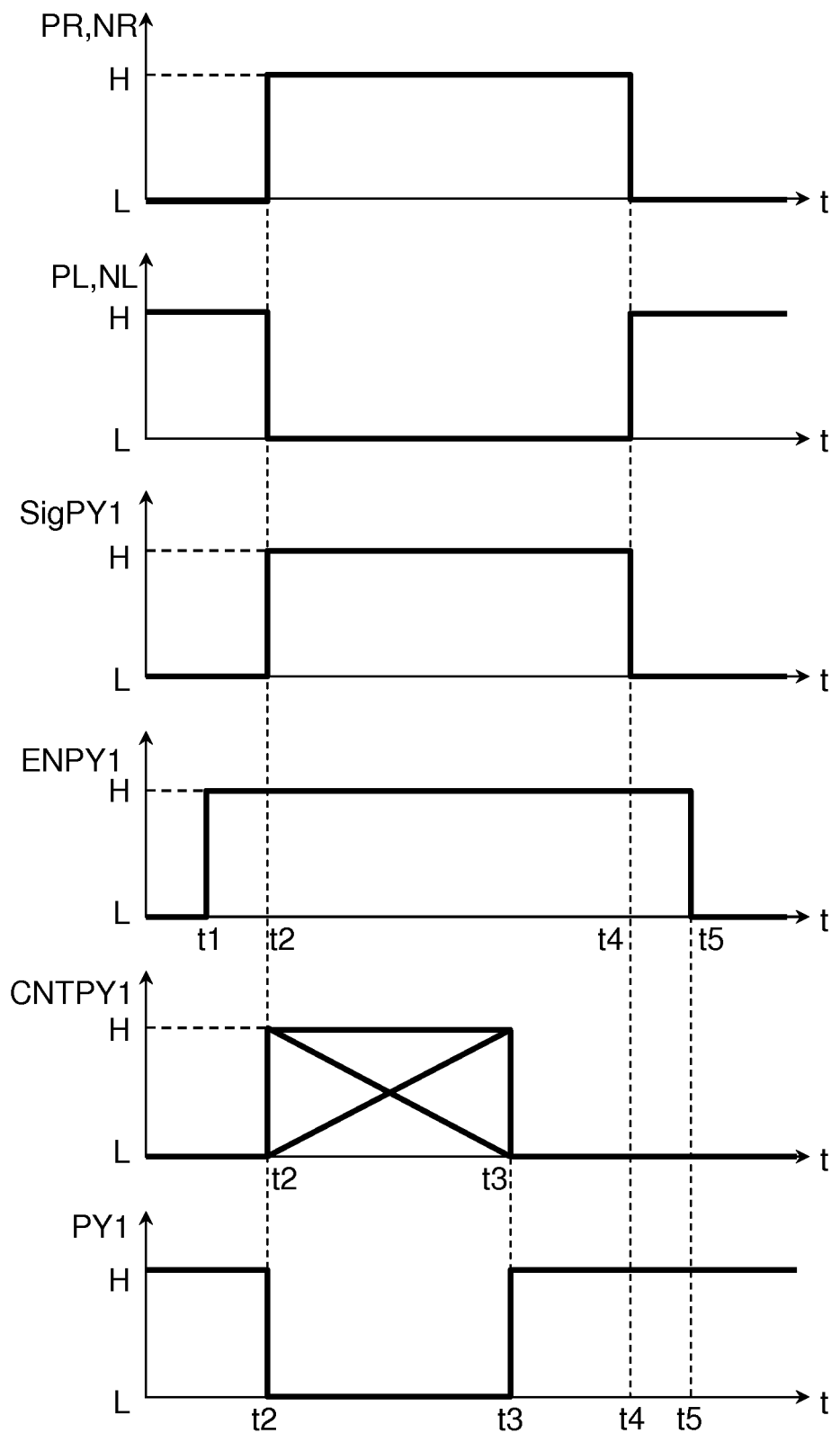
FIG. 8B is a timing chart of switch drive control signals PR, NR, PL, and NL, data signal SigPY1, enable signal ENPY1, control data signal CNTPY1, and switch control signal PY1 for showing an operation example of differential signal transmitting apparatus 1 shown in FIGS. 1 and 2.
Figure 8C:
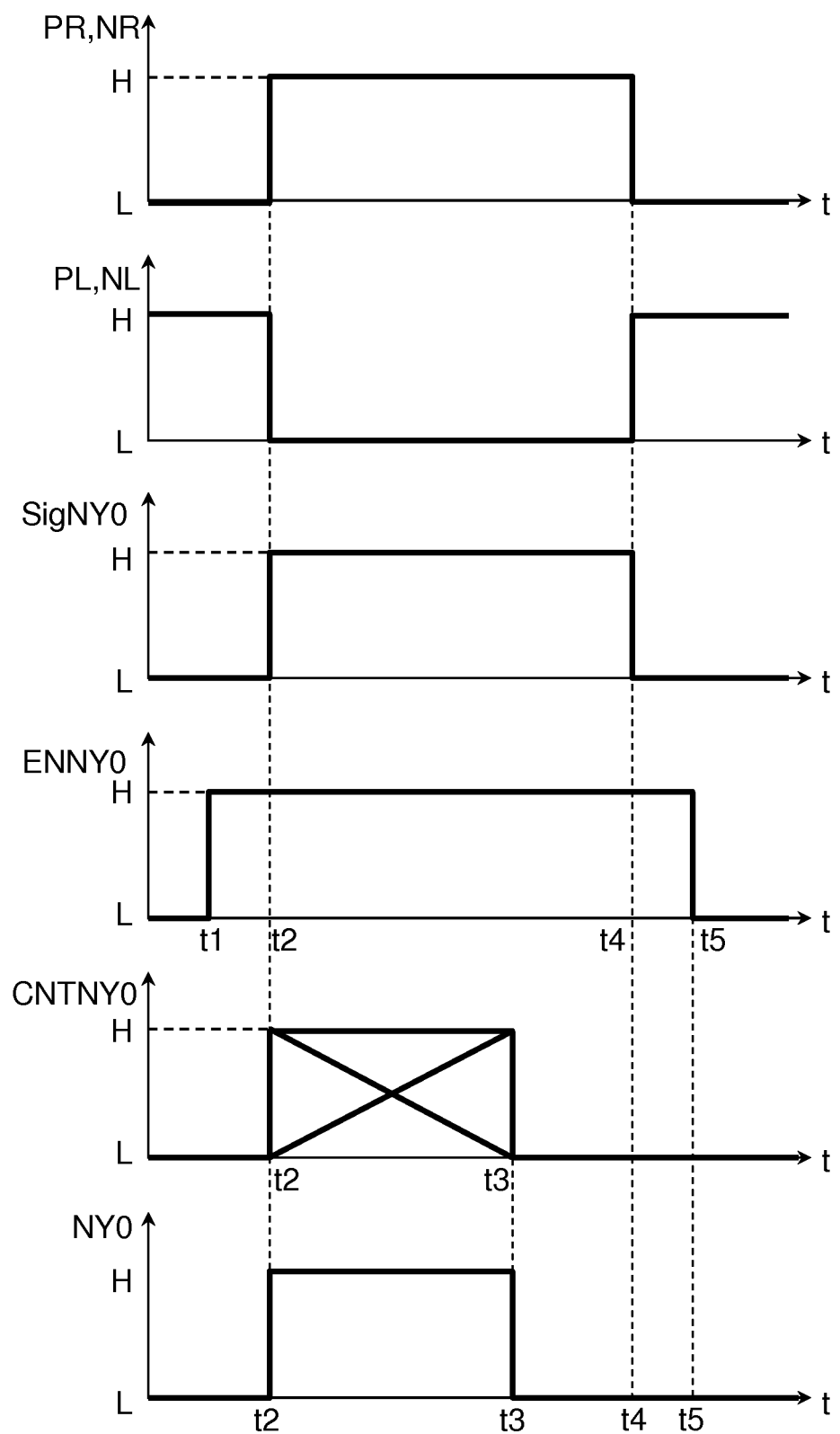
FIG. 8C is a timing chart of switch drive control signals PR, NR, PL, and NL, data signal SigNY0, enable signal ENNY0, control data signal CNTNY0, and switch control signal NY0 for showing an operation example of differential signal transmitting apparatus 1 shown in FIGS. 1 and 2.
Figure 8D:
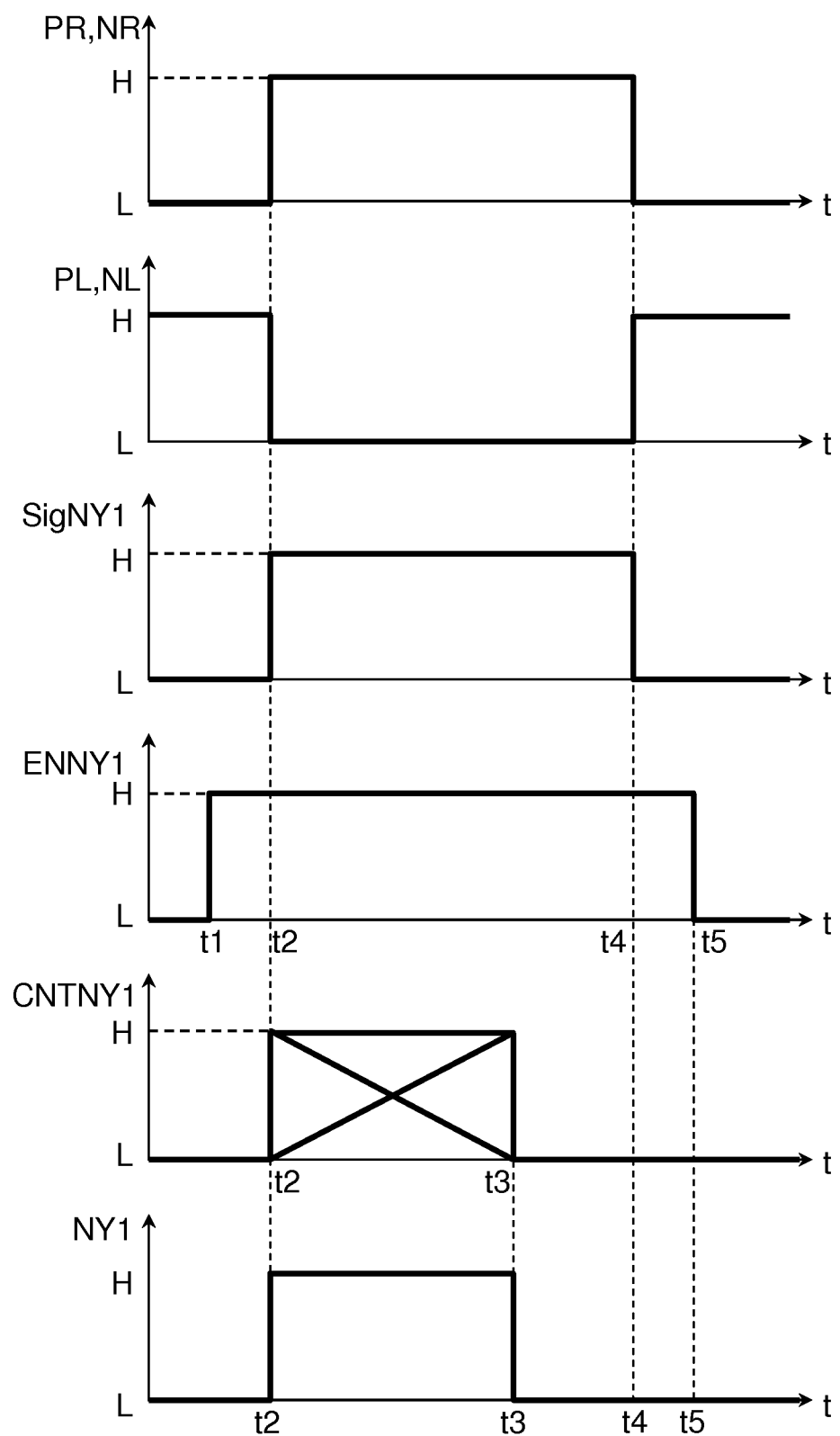
FIG. 8D is a timing chart of switch drive control signals PR, NR, PL, and NL, data signal SigNY1, enable signal ENNY1, control data signal CNTNY1, and switch control signal NY1 for showing an operation example of differential signal transmitting apparatus 1 shown in FIGS. 1 and 2.

FIG. 7 shows a switch control table stored in table memory 18 shown in FIG. 1. FIG. 8A is a timing chart of switch drive control signals PR, NR, PL, and NL, data signal SigPY0, enable signal ENPY0, control data signal CNTPY0, and switch control signal PY0 for showing an operation example of differential signal transmitting apparatus 1 shown in FIGS. 1 and 2. FIG. 8B is a timing chart of switch drive control signals PR, NR, PL, and NL, data signal SigPY1, enable signal ENPY1, control data signal CNTPY1, and switch control signal PY1 for showing an operation example of differential signal transmitting apparatus 1 shown in FIGS. 1 and 2. FIG. 8C is a timing chart of switch drive control signals PR, NR, PL, and NL, data signal SigNY0, enable signal ENNY0, control data signal CNTNY0, and switch control signal NY0 for showing an operation example of differential signal transmitting apparatus 1 shown in FIGS. 1 and 2. FIG. 8D is a timing chart of switch drive control signals PR, NR, PL, and NL, data signal SigNY1, enable signal ENNY1, control data signal CNTNY1, and switch control signal NY1 for showing an operation example of differential signal transmitting apparatus 1 shown in FIGS. 1 and 2. Switch drive control signals PR, NR, PL and NL are generated in synchronism with a drive control clock of differential signal transmitting apparatus 1.

A plurality of cases S1 to S14 to control current-pulse generating circuits 16 and 17 of common mode noise reduction circuit 11 will be described, referring to FIG. 7.

Case S1

Case S1 indicates a state in which switching transistor 33 of transmission signal output circuit 12 turns on and off faster than switching transistors 34, 35 and 36. Control circuit 15 of common mode noise reduction circuit 11 controls switching transistors 23a, 24a, 23b and 24b in response to a transition direction of signal Y0.

When signal Y0 changes from L level to H level, there occurs a period in which switching transistors 33, 34 and 35 are in an on state and switching transistor 36 is in an off state, thereby generating a current change which causes common mode noise. Control circuit 15 performs a control operation to cancel the current change. For example, control circuit 15 performs a control operation so that switching transistor 23a of current-pulse generating circuit 16 and switching transistor 24b of current-pulse generating circuit 17 turn on, synchronizing with a timing at which switching transistor 33 turns on. A period in which switching transistor 23a of current-pulse generating circuit 16 and switching transistor 24b of current-pulse generating circuit 17 are in an on state is set to, for example, a period corresponding to a transition timing of switching transistors 34 to 36. Thereby, a pulse of a predetermined duration at a predetermined timing to cancel the current change is generated. Note that in the present disclosure, a signal "synchronized" with another signal or a signal generated in "synchronism" with another signal means that the signal changes due to a transition of this another signal. However, the transition timings of the signal and the another signal do not necessarily have to occur exactly at the same time. For example, those transition timings may be somewhat different from each other.

When signal Y0 changes from H level to L level, there occurs a period in which switching transistors 33, 34 and 35 are in an off state and switching transistor 36 is in an on state, thereby generating a current change which causes common mode noise. Control circuit 15 performs a control operation to cancel the current change. For example, control circuit 15 performs a control operation so that switching transistor 23b of current-pulse generating circuit 17 turns on, synchronizing with a timing at which switching transistor 33 turns off. A period in which switching transistor 23b of current-pulse generating circuit 17 is in an on state is set to, for example, a period corresponding to a transition timing of switching transistors 34 to 36. Thereby, a pulse of a predetermined duration at a predetermined timing to cancel the current change is generated.

Case S2

Case S2 indicates a state in which switching transistor 33 of transmission signal output circuit 12 turns on and off slower than switching transistors 34, 35 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33, 34 and 35 are in an off state and switching transistor 36 is in an on state, thereby generating a current change which causes common mode noise. Control circuit 15 performs a control operation to cancel the current change. For example, control circuit 15 performs a control operation so that switching transistor 23b of current-pulse generating circuit 17 turns on, synchronizing with a transition timing of switching transistors 34 to 36. A period in which switching transistor 23b of current-pulse generating circuit 17 is in an on state is set to, for example, a period corresponding to a transition timing of switching transistor 33. Thereby, a pulse of a predetermined duration at a predetermined timing to cancel the current change is generated.

When signal Y0 changes from H level to L level, there occurs a period in which switching transistors 33, 34 and 35 are in an on state and switching transistor 36 is in an off state, thereby generating a current change which causes common mode noise. Control circuit 15 performs a control operation to cancel the current change. For example, control circuit 15 performs a control operation so that switching transistor 23a of current-pulse generating circuit 16 and switching transistor 24b of current-pulse generating circuit 17 turn on, synchronizing with a transition timing of switching transistors 34 to 35. A period in which switching transistor 23a of current-pulse generating circuit 16 and switching transistor 24b of current-pulse generating circuit 17 are in an on state is set to, for example, a period corresponding to a transition timing of switching transistor 33. Thereby, a pulse of a predetermined duration at a predetermined timing to cancel the current change is generated.

Case S3

Case S3 indicates a state in which switching transistor 34 of transmission signal output circuit 12 turns on and off faster than switching transistors 33, 35 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33, 34 and 36 are in an off state and switching transistor 35 is in an on state, thereby generating a current change which causes common mode noise. Control circuit 15 performs a control operation to cancel the current change. For example, control circuit 15 performs a control operation so that switching transistor 24b of current-pulse generating circuit 17 turns on, synchronizing with a timing at which switching transistor 34 turns off. A period in which switching transistor 24b of current-pulse generating circuit 17 is in an on state is set to, for example, a period corresponding to a transition timing of switching transistors 33, 35 and 36. Thereby, a pulse of a predetermined duration at a predetermined timing to cancel the current change is generated.

When signal Y0 changes from H level to L level, there occurs a period in which switching transistors 33, 34 and 36 are in an on state and switching transistor 35 is in an off state, thereby generating a current change which causes common mode noise. Control circuit 15 performs a control operation to cancel the current change. For example, control circuit 15 performs a control operation so that switching transistor 23b of current-pulse generating circuit 17 and switching transistor 24a of current-pulse generating circuit 16 turn on, synchronizing with a timing on which switching transistor 34 turns on. A period in which switching transistor 23b of current-pulse generating circuit 17 and switching transistor 24a of current-pulse generating circuit 16 are in an on state is set to, for example, a period corresponding to a transition timing of switching transistors 33, 35 and 36. Thereby, a pulse of a predetermined duration at a predetermined timing to cancel the current change is generated.

Case S4

Case S4 indicates a state in which switching transistor 34 of transmission signal output circuit 12 turns on and off slower than switching transistors 33, 35 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33, 34 and 36 are in an on state and switching transistor 35 is in an off state, thereby generating a current change which causes common mode noise. Control circuit 15 performs a control operation to cancel the current change. For example, control circuit 15 performs a control operation so that switching transistor 24a of current-pulse generating circuit 16 and switching transistor 23b of current-pulse generating circuit 17 turn on, synchronizing with a transition timing of switching transistors 33, 35 and 36. A period in which switching transistor 24a of current-pulse generating circuit 16 and switching transistor 23b of current-pulse generating circuit 17 are in an on state is set to, for example, a period corresponding to a transition timing of switching transistor 34. Thereby, a pulse of a predetermined duration at a predetermined timing to cancel the current change is generated.

When signal Y0 changes from H level to L level, there occurs a period in which switching transistors 33, 34 and 36 are in an off state and switching transistor 35 is in an on state, thereby generating a current change which causes common mode noise. Control circuit 15 performs a control operation to cancel the current change. For example, control circuit 15 performs a control operation so that switching transistor 24b of current-pulse generating circuit 17 turns on, synchronizing with a transition timing of switching transistors 33, 35 and 36. A period in which switching transistor 24b of current-pulse generating circuit 17 is in an on state is set to, for example, a period corresponding to a transition timing of switching transistor 34. Thereby, a pulse of a predetermined duration at a predetermined timing to cancel the current change is generated.

Case S5

Case S5 indicates a state in which switching transistor 35 of transmission signal output circuit 12 turns on and off faster than switching transistors 33, 34 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33, 35 and 36 are in an off state and switching transistor 34 is in an on state, thereby generating a current change which causes common mode noise. Control circuit 15 performs a control operation to cancel the current change. For example, control circuit 15 performs a control operation so that switching transistor 23a of current-pulse generating circuit 16 turns on, synchronizing with a timing in which switching transistor 35 turns off. A period in which switching transistor 23a of current-pulse generating circuit 16 is in an on state is set to, for example, a period corresponding to a transition timing of switching transistors 33, 34 and 36. Thereby, a pulse of a predetermined duration at a predetermined timing to cancel the current change is generated.

When signal Y0 changes from H level to L level, there occurs a period in which switching transistors 33, 35 and 36 are in an on state and switching transistor 34 is in an off state, thereby generating a current change which causes common mode noise. Control circuit 15 performs a control operation to cancel the current change. For example, control circuit 15 performs a control operation so that switching transistor 23b of current-pulse generating circuit 17 and switching transistor 24a of current-pulse generating circuit 16 turn on, synchronizing with a timing at which switching transistor 35 turns on. A period in which switching transistor 23b of current-pulse generating circuit 17 and switching transistor 24a of current-pulse generating circuit 16 are in an on state is set to, for example, a period corresponding to a transition timing of switching transistors 33, 34 and 36. Thereby, a pulse of a predetermined duration at a predetermined timing to cancel the current change is generated.

Case S6

Case S6 indicates a state in which switching transistor 35 of transmission signal output circuit 12 turns on and off slower than switching transistors 33, 34 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33, 35 and 36 are in an on state and switching transistor 34 is in an off state, thereby generating a current change which causes common mode noise. Control circuit 15 performs a control operation to cancel the current change. For example, control circuit 15 performs a control operation so that switching transistor 23b of current-pulse generating circuit 17 and switching transistor 24a of current-pulse generating circuit 16 turn on, synchronizing with a transition timing of switching transistors 33, 34 and 36. A period in which switching transistor 23b of current-pulse generating circuit 17 and switching transistor 24a of current-pulse generating circuit 16 are in an on state is set to, for example, a period corresponding to a transition timing of switching transistor 35. Thereby, a pulse of a predetermined duration at a predetermined timing to cancel the current change is generated.

When signal Y0 changes from H level to L level, there occurs a period in which switching transistors 33, 35 and 36 are in an off state and switching transistor 34 is in an on state, thereby generating a current change which causes common mode noise. Control circuit 15 performs a control operation to cancel the current change. For example, control circuit 15 performs a control operation so that switching transistor 23a of current-pulse generating circuit 16 turns on, synchronizing with a transition timing of switching transistors 33, 34 and 36. A period in which switching transistor 23a of current-pulse generating circuit 16 is in an on state is set to, for example, a period corresponding to a transition timing of switching transistor 35. Thereby, a pulse of a predetermined duration at a predetermined timing to cancel the current change is generated.

Case S7

Case S7 indicates a state in which switching transistor 36 of transmission signal output circuit 12 turns on and off faster than switching transistors 33, 34 and 35. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 34, 35 and 36 are in an on state and switching transistor 33 is in an off state, thereby generating a current change which causes common mode noise. Control circuit 15 performs a control operation to cancel the current change. For example, control circuit 15 performs a control operation so that switching transistor 23a of current-pulse generating circuit 16 and switching transistor 24b of current-pulse generating circuit 17 turn on, synchronizing with a timing at which switching transistor 36 turns on. A period in which switching transistor 23a of current-pulse generating circuit 16 and switching transistor 24b of current-pulse generating circuit 17 are in an on state is set to, for example, a period corresponding to a transition timing of switching transistors 33 to 35. Thereby, a pulse of a predetermined duration at a predetermined timing to cancel the current change is generated.

When signal Y0 changes from H level to L level, there occurs a period in which switching transistors 34, 35 and 36 are in an off state and switching transistor 33 is in an on state, thereby generating a current change which causes common mode noise. Control circuit 15 performs a control operation to cancel the current change. For example, control circuit 15 performs a control operation so that switching transistor 24a of current-pulse generating circuit 16 turns on, synchronizing with a timing at which switching transistor 36 turns off. A period in which switching transistor 24a of current-pulse generating circuit 16 is in an on state is set to, for example, a period corresponding to a transition timing of switching transistors 33 to 35. Thereby, a pulse of a predetermined duration at a predetermined timing to cancel the current change is generated.

Case S8

Case S8 indicates a state in which switching transistor 36 of transmission signal output circuit 12 turns on and off slower than switching transistors 33, 34 and 35. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 34, 35 and 36 are in an off state and switching transistor 33 is in an on state, thereby generating a current change which causes common mode noise. Control circuit 15 performs a control operation to cancel the current change. For example, control circuit 15 performs a control operation so that switching transistor 24a of current-pulse generating circuit 16 turns on, synchronizing with a transition timing of switching transistors 33, 34 and 35. A period in which switching transistor 24a of current-pulse generating circuit 16 is in an on state is set to, for example, a period corresponding to a transition timing of switching transistor 36. Thereby, a pulse of a predetermined duration at a predetermined timing to cancel the current change is generated.

When signal Y0 changes from H level to L level, there occurs a period in which switching transistors 34, 35 and 36 are in an on state and switching transistor 33 is in an off state, thereby generating a current change which causes common mode noise. Control circuit 15 performs a control operation to cancel the current change. For example, control circuit 15 performs a control operation so that switching transistor 24b of current-pulse generating circuit 17 and switching transistor 23a of current-pulse generating circuit 16 turn on, synchronizing with a transition timing of switching transistors 33, 34 and 35. A period in which switching transistor 24b of current-pulse generating circuit 17 and switching transistor 23a of current-pulse generating circuit 16 are in an on state is set to, for example, a period corresponding to a transition timing of switching transistor 36. Thereby, a pulse of a predetermined duration at a predetermined timing to cancel the current change is generated.

Case S9

Case S9 indicates a state in which switching transistors 33 and 34 of transmission signal output circuit 12 turns on and off faster than switching transistors 35 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33 and 35 are in an on state and switching transistors 34 and 36 are in an off state, thereby generating a current change which causes common mode noise. Control circuit 15 performs a control operation to cancel the current change. For example, control circuit 15 performs a control operation so that switching transistor 24b of current-pulse generating circuit 17 turns on, synchronizing with a transition timing of switching transistors 33 and 34. A period in which switching transistor 24b of current-pulse generating circuit 17 is in an on state is set to, for example, a period corresponding to a transition timing of switching transistors 35 and 36. Thereby, a pulse of a predetermined duration at a predetermined timing to cancel the current change is generated.

When signal Y0 changes from H level to L level, there occurs a period in which switching transistors 33 and 35 are in an off state and switching transistors 34 and 36 are in an on state, thereby generating a current change which causes common mode noise. Control circuit 15 performs a control operation to cancel the current change. For example, control circuit 15 performs a control operation so that switching transistor 23b of current-pulse generating circuit 17 turns on, synchronizing with a transition timing of switching transistors 33 and 34. A period in which switching transistor 23b of current-pulse generating circuit 17 is in an on state is set to, for example, a period corresponding to a transition timing of switching transistors 35 and 36. Thereby, a pulse of a predetermined duration at a predetermined timing to cancel the current change is generated.

Case S10

Case S10 indicates a state in which switching transistors 33 and 35 of transmission signal output circuit 12 turn on and off faster than switching transistors 34 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33 and 34 are in an on state and switching transistors 35 and 36 are in an off state, so that a current change to cause common mode noise is generated. Control circuit 15 performs a control operation to cancel the current change. For example, control circuit 15 performs a control operation so that switching transistor 23a of current-pulse generating circuit 16 and switching transistor 24b of current-pulse generating circuit 17 turn on, synchronizing with a transition timing of switching transistors 33 and 35. A period in which switching transistor 23a of current-pulse generating circuit 16 and switching transistor 24b of current-pulse generating circuit 17 are in an on state is set to, for example, a period corresponding to a transition timing of switching transistors 34 and 36. Thereby, a pulse of a predetermined duration at a predetermined timing to cancel the current change is generated.

When signal Y0 changes from H level to L level, there occurs a period in which switching transistors 33 and 34 are in an off state and switching transistors 35 and 36 are in an on state, thereby generating a current change which causes common mode noise. Control circuit 15 performs a control operation to cancel the current change. For example, control circuit 15 performs a control operation so that switching transistor 23b of current-pulse generating circuit 17 and switching transistor 24a of current-pulse generating circuit 16 turn on, synchronizing with a transition timing of switching transistors 33 and 35. A period in which switching transistor 23b of current-pulse generating circuit 17 and switching transistor 24a of current-pulse generating circuit 16 are in an on state is set to, for example, a period corresponding to a transition timing of switching transistors 34 and 36. Thereby, a pulse of a predetermined duration at a predetermined timing to cancel the current change is generated.

Case S11

Case S11 indicates a state in which switching transistors 33 and 36 of transmission signal output circuit 12 turn on and off faster than switching transistors 34 and 35. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33 to 36 are in an on state, thereby generating a current change which causes common mode noise. Control circuit 15 performs a control operation to cancel the current change. For example, control circuit 15 performs a control operation so that switching transistor 23a of current-pulse generating circuit 16 and switching transistor 24b of current-pulse generating circuit 17 turn on, synchronizing with a transition timing of switching transistors 33 and 36. A period in which switching transistor 23a of current-pulse generating circuit 16 and switching transistor 24b of current-pulse generating circuit 17 are in an on state is set to, for example, a period corresponding to a transition timing of switching transistors 34 and 35. Thereby, a pulse of a predetermined duration at a predetermined timing to cancel the current change is generated.

When signal Y0 changes from H level to L level, there occurs a period in which switching transistors 33 to 36 are in an off state, thereby generating a current change which causes common mode noise. Control circuit 15 performs a control operation to cancel the current change. For example, control circuit 15 performs a control operation so that switching transistor 23b of current-pulse generating circuit 17 and switching transistor 24a of current-pulse generating circuit 16 turn on, synchronizing with a transition timing of switching transistors 33 and 36. A period in which switching transistor 23b of current-pulse generating circuit 17 and switching transistor 24a of current-pulse generating circuit 16 are in an on state is set to, for example, a period corresponding to a transition timing of switching transistors 34 and 35. Thereby, a pulse of a predetermined duration at a predetermined timing to cancel the current change is generated.

Case S12

Case S12 indicates a state in which switching transistors 34 and 35 of transmission signal output circuit 12 turn on and off faster than switching transistors 33 and 36. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33 to 36 are in an off state, thereby generating a current change which causes common mode noise. Control circuit 15 performs a control operation to cancel the current change. For example, control circuit 15 performs a control operation so that switching transistor 23a of current-pulse generating circuit 16 and switching transistor 24b of current-pulse generating circuit 17 turn on, synchronizing with a transition timing of switching transistors 34 and 35. A period in which switching transistor 23a of current-pulse generating circuit 16 and switching transistor 24b of current-pulse generating circuit 17 are in an on state is set to, for example, a period corresponding to a transition timing of switching transistors 33 and 36. Thereby, a pulse of a predetermined duration at a predetermined timing to cancel the current change is generated.

When signal Y0 changes from H level to L level, there occurs a period in which switching transistors 33 to 36 are in an on state, thereby generating a current change which causes common mode noise. Control circuit 15 performs a control operation to cancel the current change. For example, control circuit 15 performs a control operation so that switching transistor 23b of current-pulse generating circuit 17 and switching transistor 24a of current-pulse generating circuit 16 turn on, synchronizing with a transition timing of switching transistors 34 and 35. A period in which switching transistor 23b of current-pulse generating circuit 17 and switching transistor 24a of current-pulse generating circuit 16 are in an on state is set to, for example, a period corresponding to a transition timing of switching transistors 33 and 36. Thereby, a pulse of a predetermined duration at a predetermined timing to cancel the current change is generated.

Case S13

Case S13 indicates a state in which switching transistors 34 and 36 of transmission signal output circuit 12 turn on and off faster than switching transistors 33 and 35. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33 and 34 are in an off state and switching transistors 35 and 36 are in an on state, thereby generating a current change which causes common mode noise. Control circuit 15 performs a control operation to cancel the current change. For example, control circuit 15 performs a control operation so that switching transistor 23a of current-pulse generating circuit 16 and switching transistor 24b of current-pulse generating circuit 17 turn on, synchronizing with a transition timing of switching transistors 34 and 36. A period in which switching transistor 23a of current-pulse generating circuit 16 and switching transistor 24b of current-pulse generating circuit 17 are in an on state is set to, for example, a period corresponding to a transition timing of switching transistors 33 and 35. Thereby, a pulse of a predetermined duration at a predetermined timing to cancel the current change is generated.

When signal Y0 changes from H level to L level, there occurs a period in which switching transistors 33 and 34 are in an on state and switching transistors 35 and 36 are in an off state, thereby generating a current change which causes common mode noise. Control circuit 15 performs a control operation to cancel the current change. For example, control circuit 15 performs a control operation so that switching transistor 23b of current-pulse generating circuit 17 and switching transistor 24a of current-pulse generating circuit 16 turn on, synchronizing with a transition timing of switching transistors 34 and 36. A period in which switching transistor 23b of current-pulse generating circuit 17 and switching transistor 24a of current-pulse generating circuit 16 are in an on state is set to, for example, a period corresponding to a transition timing of switching transistors 33 and 35. Thereby, a pulse of a predetermined duration at a predetermined timing to cancel the current change is generated.

Case S14

Case S14 indicates a state in which switching transistors 35 and 36 of transmission signal output circuit 12 turn on and off faster than switching transistors 33 and 34. Control circuit 15 of common mode noise reduction circuit 11 controls switching transistors 23a, 24a, 23b and 24b according to a transition direction of signal Y0.

When signal Y0 changes from L level to H level, there occurs a period in which switching transistors 33 and 35 are in an off state and switching transistors 34 and 36 are in an on state, thereby generating a current change which causes common mode noise. Control circuit 15 performs a control operation to cancel the current change. For example, control circuit 15 performs a control operation so that switching transistor 23a of current-pulse generating circuit 16 turns on, synchronizing with a transition timing of switching transistors 35 and 36. A period in which switching transistor 23a of current-pulse generating circuit 16 is in an on state is set to, for example, a period corresponding to a transition timing of switching transistors 33 and 34. Thereby, a pulse of a predetermined duration at a predetermined timing to cancel the current change is generated.

When signal Y0 changes from H level to L level, there occurs a period in which switching transistors 33 and 35 are in an on state and switching transistors 34 and 36 are in an off state, thereby generating a current change which causes common mode noise. Control circuit 15 performs a control operation to cancel the current change. For example, control circuit 15 performs a control operation so that switching transistor 24a of current-pulse generating circuit 16 turns on, synchronizing with a transition timing of switching transistors 35 and 36. A period in which switching transistor 24a of current-pulse generating circuit 16 is in an on state is set to, for example, a period corresponding to a transition timing of switching transistors 33 and 34. Thereby, a pulse of a predetermined duration at a predetermined timing to cancel the current change is generated.

As described referring to switch the control table shown in FIG. 7, control circuit 15 controls each of switching transistors 23a, 24a, 23b and 24b, based on transition timings of switching transistors 33 to 36, to cancel current changes of common mode noise. In a real situation, however, at a moment when each of switching transistors 33 to 36 switches, an impulsive noise of the opposite direction may appear before a main noise appears. Therefore, the transition timings of switching transistors 23a, 24a, 23b and 24b are not necessarily exactly the same as the transition timings of switching transistors 33 to 36. The width and timing of the pulse are adjusted so that the common mode noise becomes a minimum based on a measurement that will be described later.

An operation example of common mode noise reduction circuit 11 will be described below referring to FIGS. 8A to 8D. In FIGS. 8A to 8D, control data signals CNTPY0, CNTPY1, CNTNY0 and CNTNY1 are selection signals for selector circuit 52 to select one of delay times corresponding to buffers 50-1 to 50-N. Control data signals CNTPY0, CNTPY1, CNTNY0 and CNTNY1 are, for example, 4-bit parallel data signals.

As shown in FIG. 8A, data signal SigPY0 changes from L level to H level to turn switching transistor 23b on at a predetermined timing. Data signal SigPY0 returns to L level after a time width of a generated pulse from the predetermined timing and before the next clock timing. Enable signal ENPY0 becomes H level before data signal SigPY0 changes from L level to H level. Control data signal CNTPY0 controls selector circuit 52 so that switching transistor 23b is maintained in an on state for a predetermined period.

As shown in FIG. 8B, data signal SigPY1 changes from L level to H level so that switching transistor 23a turns on at a predetermined timing. Data signal SigPY1 returns to L level after a time width of a generated pulse from the predetermined timing and before the next clock timing. Enable signal ENPY1 becomes H level before data signal SigPY1 changes from L level to H level. Control data signal CNTPY1 controls selector circuit 52 so that switching transistor 23a is maintained in an on state for a predetermined period.

As shown in FIG. 8C, data signal SigNY0 changes from L level to H level to turn switching transistor 24b on at a predetermined timing. Data signal SigNY0 returns to L level after a time width of a generated pulse from the predetermined timing and before the next clock timing. Enable signal ENNY0 becomes H level before data signal SigNY0 changes from L level to H level. Control data signal CNTNY0 controls selector circuit 52 so that switching transistor 24b is maintained in an on state for a predetermined period.

As shown in FIG. 8D, data signal SigNY1 changes from L level to H level so that switching transistor 24a turns on at a predetermined timing. Data signal SigNY1 returns to L level after a time width of a generated pulse from the predetermined timing and before the next clock timing. Enable signal ENNY1 becomes H level before data signal SigNY1 changes from L level to H level. Control data signal CNTNY1 controls selector circuit 52 so that switching transistor 24a is maintained in an on state for a predetermined period.

As shown in FIGS. 8A to 8D, each of signals SigPY0, SigPY1, SigNY0 and SigNY1 is synchronized with each of control signals PL, PR, NL and NR for each of switching transistors 33, 35, 34 and 36 of transmission signal output circuit 12. In other words, control circuit 15 performs control operations at timings synchronized with a drive clock of transmission signal output circuit 12. Switch control signal PY0 is generated to have a pulse width selected by control data signal CNTPY0 from a rising edge of data signals SigPY0, SigPY1, SigNY0 and SigNY1, which are synchronized with control signals PL, PR, NL and NR for switching transistors 33, 35, 34 and 36 of transmission signal output circuit 12. Switch control signal NY0 is generated to have a pulse width selected by control data signal CNTNY0 from a rising edge of data signals SigPY0, SigPY1, SigNY0 and SigNY1. Switch control signals PY0, PY1, NY1 and NY0 are control signals for current-pulse generating circuits 16 and 17. Information indicating which of switch control signals PY0, PY1, NY1 and NY0 should be generated and information indicating the pulse widths of signals PY0, PY1, NY1 and NY0 are previously stored in table memory 18 of control circuit 15, for example, before shipping. The information may be fixedly stored, or may be adaptively controlled by adaptation controller 5 shown in FIG. 1 periodically during the operation.

A method of determining pulse widths of switch control signals PY0, PY1, NY1 and NY0, and selecting switching transistors 23a, 23b, 24a and 24b to determine a direction and a place for current flow flowed by current-pulse generating circuits 16 and 17 will be described below. For example, the method can be performed by actually measuring common mode noise in an evaluation test at a development stage or in a test when shipping this differential signal transmitting apparatus. This example will be described below.

As shown in FIG. 1, voltage detector 4 measures voltage values of signals Y0 and Y1 from transmission signal output circuit 12, and adaptation controller 5 calculates ((voltage value of signal Y0)+(voltage value of signal Y1))/2, so that common mode noise can be measured. Adaptation controller 5 measures common mode noise, changing a case from the plurality of cases S1 to S14 in the switch control table shown in FIG. 7, and changing a combination of pulse width and pulse timing of switch control signals PY0, PY1, NY1 and NY0. Thereby, adaptation controller 5 searches a combination with which common mode noise becomes a minimum, so that adaptation controller 5 determines pulse width and place and direction for current-pulse generating circuits 16 and 17 to flow electric current. The above stated search can employ multi-variable search algorithms. The search method may be one of various kinds of methods as long as the method can obtain a minimum value of common mode noise. The algorithm of the method may be one of various kinds of algorithm, such as a round-robin tournament, steepest descent method or the like. Combinations of switching transistors 23a, 23b, 24a and 24b for the search are not limited to those shown in the table of FIG. 7. Adaptation controller 5 may perform the search using all the possible combinations of switching transistors 23a, 23b, 24a and 24b.

According to the selection method described above, the selection method is performed based upon actually measured common mode noise in an evaluation test at a development stage or in a test when shipping this differential signal transmitting apparatus. However, voltage detector 4 and adaptation controller 5 shown in FIG. 1 can be integrated in an actual product, and have learning function to adjust the switch control table in table memory 18 periodically during the operation of this differential signal transmitting apparatus.

For example, control circuit 15, based on signal voltage of differential signals from output terminals 38 and 39, searches case, timing and signal width with which common mode noise becomes a minimum, changes a case selected from the plurality of cases described above, and changes timing and signal width of the switch control signal, so that control circuit 15 sets the search result and controls current-pulse generating circuits 16 and 17. Control circuit 15 may, during the operation of transmission signal output circuit 12, search case, timing and signal width with which common mode noise becomes a minimum, and adaptively control current-pulse generating circuits 16 and 17 based on the search result.

As described above, according to the present embodiment, control circuit 15 can generate a pulse synchronized with switching timing of transmission signal output circuit 12, and generate an electric pulse to reduce common mode noise that appears at the same timing as the electric pulse.

In the present embodiment described above, variable delay circuit 48 shown in FIG. 6 can adjust the amount of delay, changing the number of the buffers through which the signal passes. However, the present disclosure is not limited to this structure, and variable delay circuit 48 can have one of various kinds of structures as long as the delay time of output signal can be adjusted.

In the present embodiment, transmission signal output circuit 12 shown in FIG. 2 uses LVDS circuit structure. However, the present disclosure is not limited to this structure, and transmission signal output circuit 12 can have various kinds of structures as long as transmission signal output circuit 12 is a differential current drive type output circuit. In the present embodiment, common mode noise reduction circuit 11 shown in FIG. 2 is connected to output terminals 38 and 39 of transmission signal output circuit 12. However, the present disclosure is not limited to this structure. Common mode noise reduction circuit 11 can be connected to other nodes with which common mode noise reduction circuit 11 can output and receive electric current to reduce common mode noise. For example, common mode noise reduction circuit 11 may be connected to a node at which current source transistor 31 and switching transistors 33 and 35 are connected, or a node at which current source transistor 32 and switching transistors 34 and 36 are connected.

Embodiment 2

Figure 9:
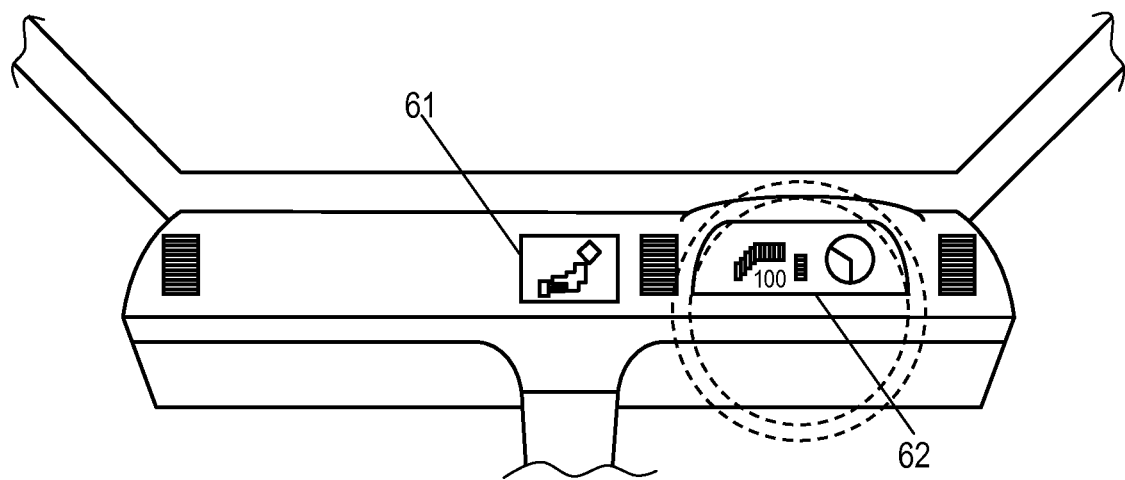
FIG. 9 shows a front view of exemplary car display devices 61 and 62 according to Embodiment 2 of the present disclosure.

FIG. 9 shows a front view of exemplary car display devices 61 and 62 according to Embodiment 2 of the present disclosure. FIG. 9 shows, as typical car display devices, car display device 62 for an instrument panel to display information necessary for driving, such as speed, engine speed, mileage, amount of fuel and so forth, and car display device 61 for a car navigation system. A part of, a plurality of parts of, or whole of car display device 62 is/are configured by a digital display device, such as a liquid crystal display, an organic electroluminescent display, or the like.

Figure 10A:
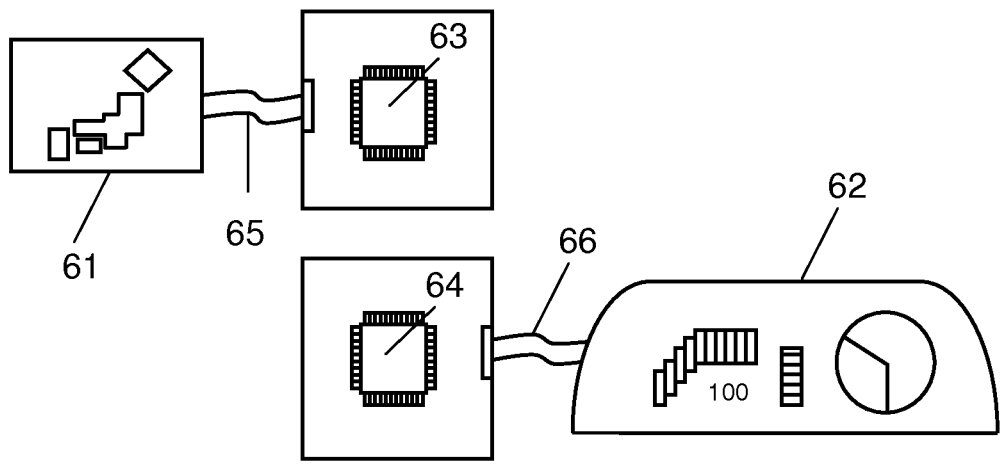
FIG. 10A is a block diagram showing connections between car display devices 61 and 62 shown in FIG. 9, and semiconductor integrated circuits 63 and 64.

FIG. 10A is a block diagram showing connections between car display devices 61 and 62 shown in FIG. 9, and semiconductor integrated circuits 63 and 64. As shown in FIG. 10A, image data for display on car display device 61 is transmitted from semiconductor integrated circuit 63 through cable 65 and so forth to car display device 61. Transmission signal output circuit 12 is integrated in semiconductor integrated circuit 63. Common mode noise generated in transmission signal output circuit 12 may be radiated from cable 65 or the like to the air and affect other electronic devices. Similarly, image data for display on car display device 62 is transmitted from semiconductor integrated circuit 64 through cable 66 and so forth to car display device 62. Transmission signal output circuit 12 is integrated in semiconductor integrated circuit 64. Common mode noise generated in transmission signal output circuit 12 may be radiated from cable 66 or the like to the air and affect other electronic devices.

According to a structure of the present embodiment, common mode noise reduction circuit 11 is integrated in semiconductor integrated circuits 63 and 64, and suppresses common mode noise to reduce electromagnetic radiation noise so that the safety of cars can be improved.

Figure 10B:
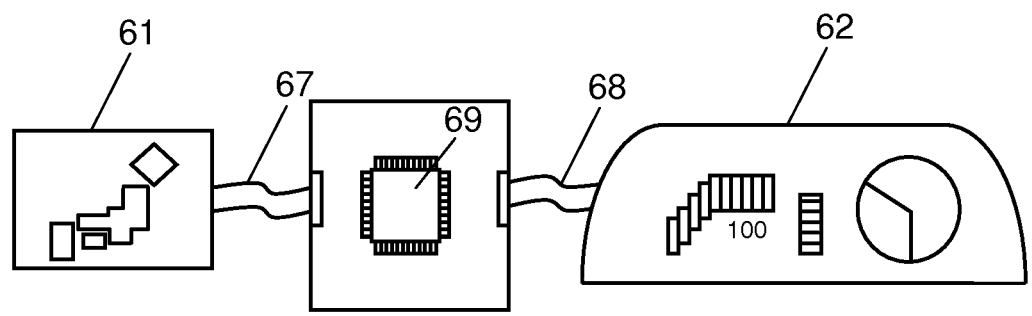
FIG. 10B is a block diagram showing a modified example of connections between car display devices 61 and 62 shown in FIG. 9 and semiconductor integrated circuit 69.

FIG. 10B is a block diagram showing a modified example of connections between car display devices 61 and 62 shown in FIG. 9 and semiconductor integrated circuit 69. As shown in FIG. 10B, one semiconductor integrated circuit may transmit image data to a plurality of display devices. For example, in FIG. 10B, display device 61 is connected to semiconductor integrated circuit 69 through cable 67, and display device 62 is also connected to semiconductor integrated circuit 69 through cable 68. The modified example described above also has the same or similar function and effect as Embodiment 2.

According to Embodiment 2 as described above, a car image display system comprises: car display devices 61 and 62; a differential signal transmitting apparatus including semiconductor integrated circuits 63 and 64; and cables 65 and 66 to connect car display devices 61 and 62 and the differential signal transmitting apparatuses. However, the present disclosure is not limited to this structure. Particularly, the embodiment can be applied to image display systems including a differential signal transmitting system that are used in homes or offices, other than car devices.

Embodiment 3

Figure 11:
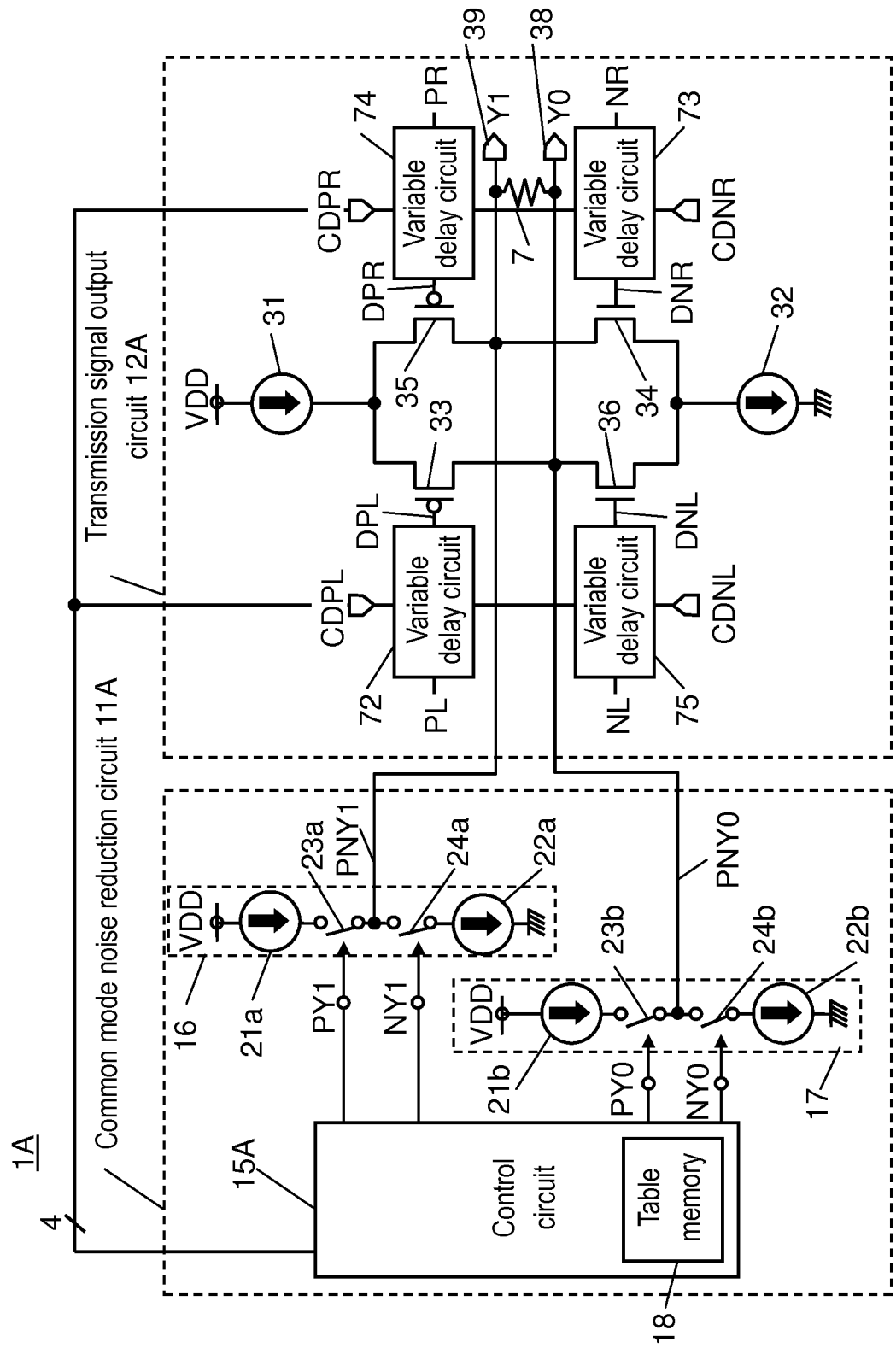
FIG. 11 is a circuit diagram showing a configuration of common mode noise reduction circuit 11A and transmission signal output circuit 12A of differential signal transmitting apparatus 1A for a differential signal transmitting system of Embodiment 3 of the present disclosure.

FIG. 11 is a circuit diagram showing a configuration of common mode noise reduction circuit 11A and transmission signal output circuit 12A of differential signal transmitting apparatus 1A for a differential signal transmitting system according to Embodiment 3 of the present disclosure. Transmission signal output circuit 12A shown in FIG. 11 is different from transmission signal output circuit 12 shown in FIG. 2, regarding the following points.

(1) Variable delay circuit 72 is inserted between an input terminal of control signal PL and a gate of switching transistor 33 so that variable delay circuit 72 delays control signal PL based on control data signal CDPL from control circuit 15A. Control data signal CDPL indicates a delay time.

(2) Variable delay circuit 74 is inserted between an input terminal of control signal PR and a gate of switching transistor 35 so that variable delay circuit 74 delays control signal PR based on control data signal CDPR from control circuit 15A. Control data signal CDPR indicates a delay time.

(3) Variable delay circuit 75 is inserted between an input terminal of control signal NL and a gate of switching transistor 36 so that variable delay circuit 75 delays control signal NL based on control data signal CDNL from control circuit 15A. Control data signal CDNL indicates a delay time.

(4) Variable delay circuit 73 is inserted between an input terminal of control signal NR and a gate of switching transistor 34 so that variable delay circuit 73 delays control signal NR based on control data signal CDNR from control circuit 15A. Control data signal CDNR indicates a delay time.

According to Embodiment 3 configured as described above, control data signal CDPL adjusts a delay time of variable delay circuit 72. Control data signal CDNR adjusts a delay time of variable delay circuit 73. Control data signal CDPR adjusts a delay time of variable delay circuit 74. Control data signal CDNL adjusts a delay time of variable delay circuit 75.

According to this structure, it is possible to individually adjust timings of control signals PL, PR, NL and NR that control transition timings of switching transistors 33 to 36.

Figure 12:
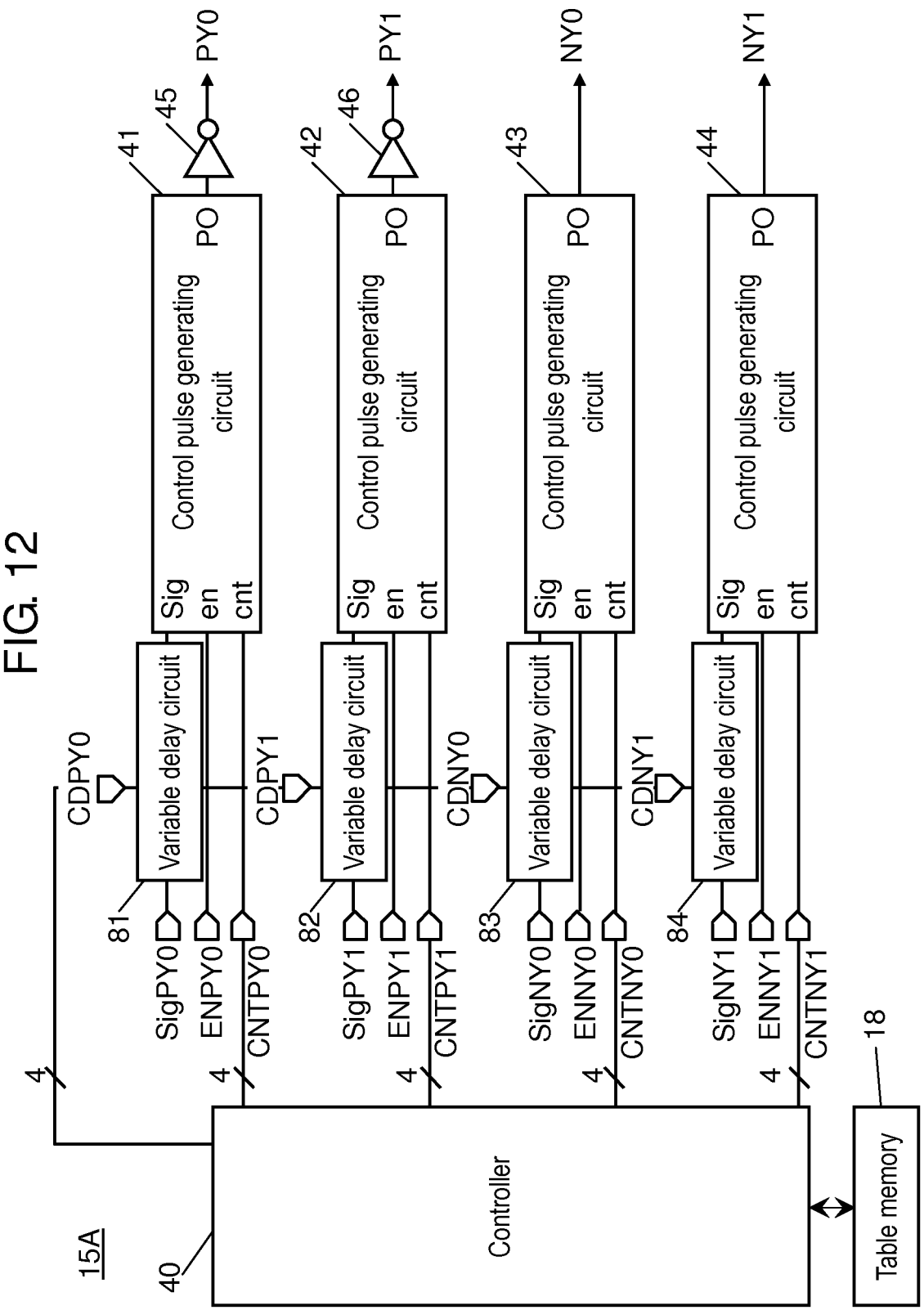
FIG. 12 is a block diagram showing a configuration of control circuit 15A shown in FIG. 11.

FIG. 12 is a block diagram showing a configuration of control circuit 15A shown in FIG. 11. Control circuit 15A shown in FIG. 12 is different from control circuit 15 shown in FIG. 4, regarding the following points.

(1) Variable delay circuit 81 that belays signal SigPY0 is inserted before control pulse generating circuit 41.
(2) Variable delay circuit 82 that belays signal SigPY1 is inserted before control pulse generating circuit 42.
(3) Variable delay circuit 83 that belays signal SigNY0 is inserted before control pulse generating circuit 43.
(4) Variable delay circuit 84 that belays signal SigNY1 is inserted before control pulse generating circuit 44.

A delay time of variable delay circuit 81 is adjusted by control data signal CDPY0 from controller 40. A delay time of variable delay circuit 82 is adjusted by control data signal CDPY1 from controller 40. A delay time of variable delay circuit 83 is adjusted by control data signal CDNY0 from controller 40. A delay time of variable delay circuit 84 is adjusted by control data signal CDNY1 from controller 40. Thereby, it is possible to individually adjust generation timings of switch control signals PY0, PY1, NY0 and NY1.

Figure 13:
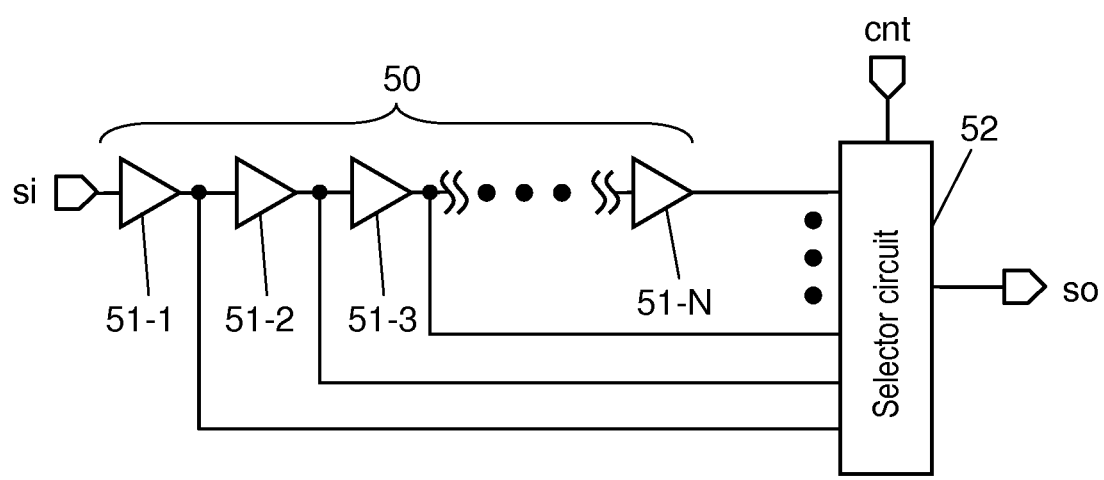
FIG. 13 is a block diagram showing a configuration of variable delay circuits 72, 73, 74, 75, 81, 82, 83, and 84 shown in FIGS. 11 and 12.

FIG. 13 is a block diagram showing a configuration of variable delay circuits 72, 73, 74, 75, 81, 82, 83, and 84 shown in FIGS. 11 and 12. As shown in FIG. 13, each of variable delay circuits 72, 73, 74, 75, 81, 82, 83 and 84 does not have inverter 53, comparing to variable delay circuit 48 shown in FIG. 6.

According to common mode noise reduction circuit 11 of the present disclosure configured as described above, it is possible to individually adjust switching timings of switching transistors 33 to 36 and generation timings of switch control signals PY0, PY1, NY0 and NY1 that generate current pulses to reduce switching noise, so that more fine setting becomes possible for reducing common mode noise.

According to the embodiments described above, it is possible to provide common mode noise reduction circuit 11 to reduce common mode noise without largely changing a conventional differential signal transmitting apparatus. Further, by decreasing the electromagnetic radiation noise, an image display device which can secure the safety necessary for car electronics devices can be provided.

According to the present embodiments, it is possible to provide a common mode noise reduction circuit by adding functions without hindering high speed operation and without changing a design of a conventional differential transmitting apparatus. It also becomes possible to provide an image display device which can secure the safety necessary for car electronics devices by reducing the electromagnetic radiation noise.

Summary of Embodiments

According to a first aspect of the present disclosure, a common mode noise reduction circuit is provided for a transmission signal output circuit having a first and a second output terminals configured to transmit differential signals from the first and second output terminals. The common mode noise reduction circuit comprises a first generating circuit configured to generate electric current to input to the first output terminal or receive electric current from the first output terminal; a second generating circuit configured to generate electric current to input to the second output terminal or receive electric current from the second output terminal; and a control circuit configured to control the first and second generating circuits so that in synchronism with a drive control clock of the transmission signal output circuit, the first and second generating circuits generate current pulses to reduce common mode noise of the differential signals to be transmitted.

According to a second aspect of the present disclosure, in the common mode noise reduction circuit of the first aspect of the present disclosure, the transmission signal output circuit comprises: a first current source having a first end connected to a direct current source; a second current source having a first end connected to the ground; a first switch connected between the first output terminal and a second end of the first current source; a second switch connected between the second output terminal and the second end of the first current source; a third switch connected between the first output terminal and a second end of the second current source; a fourth switch connected between the second output terminal and the second end of the second current source; and a terminal resistor connected between the first output terminal and the second output terminal, and the transmission signal output circuit is configured to, in synchronism with the drive control clock, generate drive control signals to the first, second, third and fourth switches to power on and off at least one of the first, second, third and fourth switches to transmit the differential signals from the first and second output terminals.

According to a third aspect of the present disclosure, in the common mode noise reduction circuit of the second aspect of the present disclosure, the control circuit comprises a memory apparatus configured to store a control table including a plurality of cases representing combinations of transition conditions of the first, second, third and fourth switches and control signals that control the first and second generating circuits according to transition of the differential signals to be transmitted from the first and second output terminals, and the control circuit is configured to, according to signal voltages of the differential signals transmitted from the first and a second output terminals, search the cases for a case in which the common mode noise becomes a minimum level with a timing and a signal width of the control signal being changed, and also search the timing and the signal width, and then set the search result to control the first and second generating circuits.

According to a fourth aspect of the present disclosure, in the common mode noise reduction circuit of the third aspect of the present disclosure, the control circuit is configured to search the case, timing and signal width which minimize the common mode noise while the transmission signal output circuit is in operation, and adaptively control the first and second generating circuits according to the search result.

According to a fifth aspect of the present disclosure, in the common mode noise reduction circuit according to one of the second to fourth aspects of the present disclosure, each of the first and second current sources includes a transistor, and each of the first, second, third and fourth switches includes a transistor.

According to a sixth aspect of the present disclosure, in the common mode noise reduction circuit according to one of the first to fifth aspects of the present disclosure, each of the first and second generating circuits comprises: a third output terminal connected to the first or second output terminal; a third current source having a first end connected to the direct current source; a fifth switch connected between a second end of the third current source and the third output terminal; a fourth current source having a first end connected to the ground; and a sixth switch connected between a second end of the fourth current source and the third output terminal, wherein the control circuit is configured to generate a switch control signal to control the fifth and sixth switches.

According to a seventh aspect of the present disclosure, in the common mode noise reduction circuit according to one of the first to fifth aspects of the present disclosure, each of the first and second generating circuits comprises: a third output terminal connected to the first or second output terminal; a series circuit including a fifth switch and a third current source and connected between the direct current source and the third output terminal; a series circuit including a sixth switch and a fourth current source and connected between the ground and the third output terminal, wherein the control circuit is configured to generate a switch control signal to control the fifth and sixth switches.

According to an eighth aspect of the present disclosure, in the common mode noise reduction circuit of the sixth or seventh aspect of the present disclosure, each of the third and fourth current sources includes a transistor, and each of the fifth and sixth switches includes a transistor.

According to a ninth aspect of the present disclosure, in the common mode noise reduction circuit of the sixth or seventh aspect of the present disclosure, the third current source and the fifth switch are configured by one transistor, and the fourth current source and the sixth switch are configured by one transistor.

According to a tenth aspect of the present disclosure, in the common mode noise reduction circuit according to one of the first to ninth aspects of the present disclosure, the control circuit is configured to control the first and second generating circuits to generate electric current to input to the first or second output terminal or receive electric current from the first or second output terminal for a predetermined period at a predetermined timing.

According to an eleventh aspect of the present disclosure, in the common mode noise reduction circuit of the tenth aspect of the present disclosure, the predetermined period and predetermined timing are previously set in the control circuit according to a measurement result of the common mode noise of the transmission signal output circuit.

According to a twelfth aspect of the present disclosure, a differential signal transmitting apparatus comprises the common mode noise reduction circuit and the transmission signal output circuit according to one of the first to eleventh aspects of the present disclosure.

According to a thirteenth aspect of the present disclosure, the differential signal transmitting apparatus of the twelfth aspect of the present disclosure configured by a semiconductor integrated circuit.

According to a fourteenth aspect of the present disclosure, the differential signal transmitting apparatus of the twelfth or thirteenth aspect of the present disclosure is configured to transmit the differential signals that are image data for display.

According to a fifteenth aspect of the present disclosure, a differential signal transmitting system comprises: the differential signal transmitting apparatus of the twelfth or thirteenth aspect of the present disclosure; and a differential signal receiving apparatus configured to receive the differential signals from the differential signal transmitting apparatus.

According to a sixteenth aspect of the present disclosure, a differential signal transmitting system is an image display system comprising the differential signal transmitting apparatus of fourteenth aspect of the present disclosure and a differential signal receiving apparatus configured to receive the differential signals from the differential signal transmitting apparatus.

According to a seventeenth aspect of the present disclosure, a car electronics device comprises the differential signal transmitting system of the sixteenth aspect of the present disclosure.

A common mode noise reduction circuit according to the present disclosure reduces common mode noise, and for example, is useful to cope with electromagnetic radiation noise from electronics devices having display apparatuses.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A common mode noise reduction circuit for a transmission-signal output circuit having a first and a second output terminals configured to transmit differential signals from the first and second output terminals, the common mode noise reduction circuit comprising:
   a first generating circuit configured to generate electric current to input to the first output terminal or receive electric current from the first output terminal;
   a second generating circuit configured to generate electric current to input to the second output terminal or receive electric current from the second output terminal; and
   a control circuit configured to control the first and second generating circuits so that in synchronism with a drive control clock of the transmission signal output circuit, the first and second generating circuits generate current pulses to reduce common mode noise of the differential signals to be transmitted,
   wherein the transmission signal output circuit comprises:
   a first current source having a first end connected to a direct current source;
   a second current source having a first end connected to the ground;
   a first switch connected between the first output terminal and a second end of the first current source;
   a second switch connected between the second output terminal and the second end of the first current source;
   a third switch connected between the first output terminal and a second end of the second current source;
   a fourth switch connected between the second output terminal and the second end of the second current source; and
   a terminal resistor connected between the first output terminal and the second output terminal, and the transmission signal output circuit is configured to, in synchronism with the drive control clock, generate drive control signals to the first, second, third and fourth switches to power on and off at least one of the first, second, third and fourth switches to transmit the differential signals from the first and second output terminals.

2. The common mode noise reduction circuit of claim 1, wherein the control circuit comprises a memory apparatus configured to store a control table including a plurality of cases representing combinations of transition conditions of the first, second, third and fourth switches and control signals that control the first and second generating circuits according to transition of the differential signals to be transmitted from the first and second output terminals, and the control circuit is configured to, according to signal voltages of the differential signals transmitted from the first and second output terminals, search the cases for a case in which the common mode noise becomes a minimum level with a timing and a signal width of the control signal being changed, and also search the timing and the signal width, and then set the search result to control the first and second generating circuits.

3. The common mode noise reduction circuit of claim 2, wherein the control circuit is configured to search the case, timing and signal width which minimize the common mode noise while the transmission signal output circuit is in operation, and adaptively control the first and second generating circuits according to the search result.

4. The common mode noise reduction circuit of claim 1, wherein each of the first and second current sources is configured by a transistor, and each of the first, second, third and fourth switches is configured by a transistor.

5. The common mode noise reduction circuit of claim 1, wherein each of the first and second generating circuits comprises:
a third output terminal connected to the first or second output terminal;
a third current source having a first end connected to the direct current source;
a fifth switch connected between a second end of the third current source and the third output terminal;
a fourth current source having a first end connected to the ground; and
a sixth switch connected between a second end of the fourth current source and the third output terminal, wherein
the control circuit is configured to generate a switch control signal to control the fifth and sixth switches.

6. The common mode noise reduction circuit of claim 1, wherein each of the first and second generating circuits comprises:
a third output terminal connected to the first or second output terminal;
a series circuit configured by a fifth switch and a third current source, and connected between the direct current source and the third output terminal;
a series circuit configured by a sixth switch and a fourth current source, and connected between the ground and the third output terminal, wherein
the control circuit is configured to generate a switch control signal to control the fifth and sixth switches.

7. The common mode noise reduction circuit of claim 5, wherein each of the third and fourth current sources is configured by a transistor, and each of the fifth and sixth switches is configured by a transistor.

8. The common mode noise reduction circuit of claim 5, wherein the third current source and the fifth switch are configured by one transistor, and the fourth current source and the sixth switch are configured by one transistor.

9. The common mode noise reduction circuit of claim 1, wherein the control circuit is configured to control the first and second generating circuits to generate electric current to input to the first or second output terminal or receive electric current from the first or second output terminal for a predetermined period at a predetermined timing.

10. The common mode noise reduction circuit of claim 9, wherein the predetermined period and predetermined timing are previously set in the control circuit according to a measurement result of the common mode noise of the transmission signal output circuit.

11. A differential signal transmitting apparatus comprising the common mode noise reduction circuit and the transmission signal output circuit of claim 1.

12. The differential signal transmitting apparatus of claim 11, in which the differential signal transmitting apparatus is configured by a semiconductor integrated circuit.

13. The differential signal transmitting apparatus of claim 11, wherein the differential signal transmitting apparatus is configured to transmit the differential signals that are image data for display.

14. A differential signal transmitting system comprising the differential signal transmitting apparatus of claim 11 and a differential signal receiving apparatus configured to receive the differential signals from the differential signal transmitting apparatus.

15. A differential signal transmitting system that is an image display system, comprising the differential signal transmitting apparatus of claim 13 and a differential signal receiving apparatus configured to receive the differential signals from the differential signal transmitting apparatus.

16. A car electronics device comprising the differential signal transmitting system of claim 15.

* * * * *